US012804892B2

(12) United States Patent
Tsai

(10) Patent No.: US 12,804,892 B2
(45) Date of Patent: Nov. 17, 2026

(54) BIT LINE CONTACT STRUCTURE, SEMICONDUCTOR DEVICE WITH CONTACT-ISOLATING SPACERS, AND METHOD FOR FABRICATING THE SAME

(71) Applicant: NANYA TECHNOLOGY CORPORATION, New Taipei City (TW)

(72) Inventor: Yi-Ting Tsai, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 332 days.

(21) Appl. No.: 18/676,829

(22) Filed: May 29, 2024

(65) Prior Publication Data

US 2025/0374529 A1 Dec. 4, 2025

(51) Int. Cl.
*H10B 12/00* (2023.01)

(52) U.S. Cl.
CPC .......... *H10B 12/485* (2023.02); *H10B 12/02* (2023.02)

(58) Field of Classification Search
CPC . H10B 12/0335; H10B 12/315; H10B 12/482
See application file for complete search history.

(56) References Cited

U.S. PATENT DOCUMENTS

2023/0157036 A1* 5/2023 Yang .................... H10B 12/482
257/213

FOREIGN PATENT DOCUMENTS

| | | |
|---|---|---|
| CN | 116133420 A | 5/2023 |
| TW | 202341430 A | 10/2023 |

OTHER PUBLICATIONS

Office Action and and the search report mailed on Sep. 9, 2025 related to Taiwanese Application No. 113146179.
Summary translation of the Office Action and and the search report mailed on Sep. 9, 2025 related to Taiwanese Application No. 113146179.

* cited by examiner

*Primary Examiner* — Marc-Anthony Armand
(74) *Attorney, Agent, or Firm* — Xuan Zhang

(57) ABSTRACT

The present application discloses a bit line contact structure, a semiconductor device, and a method for fabricating the semiconductor device. The bit line contact structure includes a bit line contact having a rectangular cross-sectional profile in a top-view perspective and including two first sides parallel to each other and two second sides parallel to each other and perpendicular to the two first sides; and two contact-isolating spacers respectively and correspondingly covering the two first sides of the bit line contact.

19 Claims, 45 Drawing Sheets

BIT LINE CONTACT STRUCTURE, SEMICONDUCTOR DEVICE WITH CONTACT-ISOLATING SPACERS, AND METHOD FOR FABRICATING THE SAME

TECHNICAL FIELD

The present disclosure relates to a bit line contact structure, a semiconductor device, and a method for fabricating the semiconductor device, and more particularly, to a bit line contact structure with contact-isolating spacers, a semiconductor device with the bit line contact structure including the contact-isolating spacers, and a method for fabricating the semiconductor device with the bit line contact structure including the contact-isolating spacers

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a bit line contact structure, including a bit line contact having a rectangular cross-sectional profile in a top-view perspective and including two first sides parallel to each other and two second sides parallel to each other and perpendicular to the two first sides; and two contact-isolating spacers respectively and correspondingly covering the two first sides of the bit line contact.

Another aspect of the present disclosure provides a semiconductor device including a substrate; a bottom insulating layer positioned on the substrate; a bit line contact structure including a bit line contact positioned penetrating the bottom insulating layer and extending to the substrate, with two parallel first sides along a first direction in a top-view perspective, and two parallel second sides along a second direction perpendicular to the first direction; and two contact-isolating spacers positioned on the two first sides of the bit line contact; and a bit line structure positioned on the bit line contact structure and on the bottom insulating layer and extending along the first direction in a top-view perspective.

Another aspect of the present disclosure provides a method for fabricating a semiconductor device including providing a substrate, forming an impurity region in the substrate, and forming a bottom insulating layer on the substrate; forming two word line structures penetrating the bottom insulating layer, extending to the substrate, and dividing the impurity region into two drain regions with a common source region in between; forming a bit line contact opening penetrating the bottom insulating layer, extending to the substrate, and exposing the common source region; conformally forming a contact-isolating layer covering a sidewall of the bit line contact opening, wherein the contact-isolating layer includes two first portions parallel to each other and extending along a first direction in a top-view perspective and two second portions parallel to each other and extending along a second direction perpendicular to the first direction; forming two hard mask layers masking the two first portions and performing an etching process to remove the two second portions, thereby turning the first portions into two contact-isolating spacers; and removing the two hard mask layers and forming a bit line contact filling the bit line contact opening. The bit line contact and the two contact-isolating spacers together configure a bit line contact structure.

Due to the design of the semiconductor device of the present disclosure, the leakage between adjacent bit line structures may be avoided by employing the contact-isolating spacers. As a result, the yield and performance of the semiconductor device may be improved. In addition, the parasitic capacitance between the bit line structure and the adjacent cell contact layer may also be reduced by the spacer structure. Consequently, the performance of the semiconductor device may be further improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
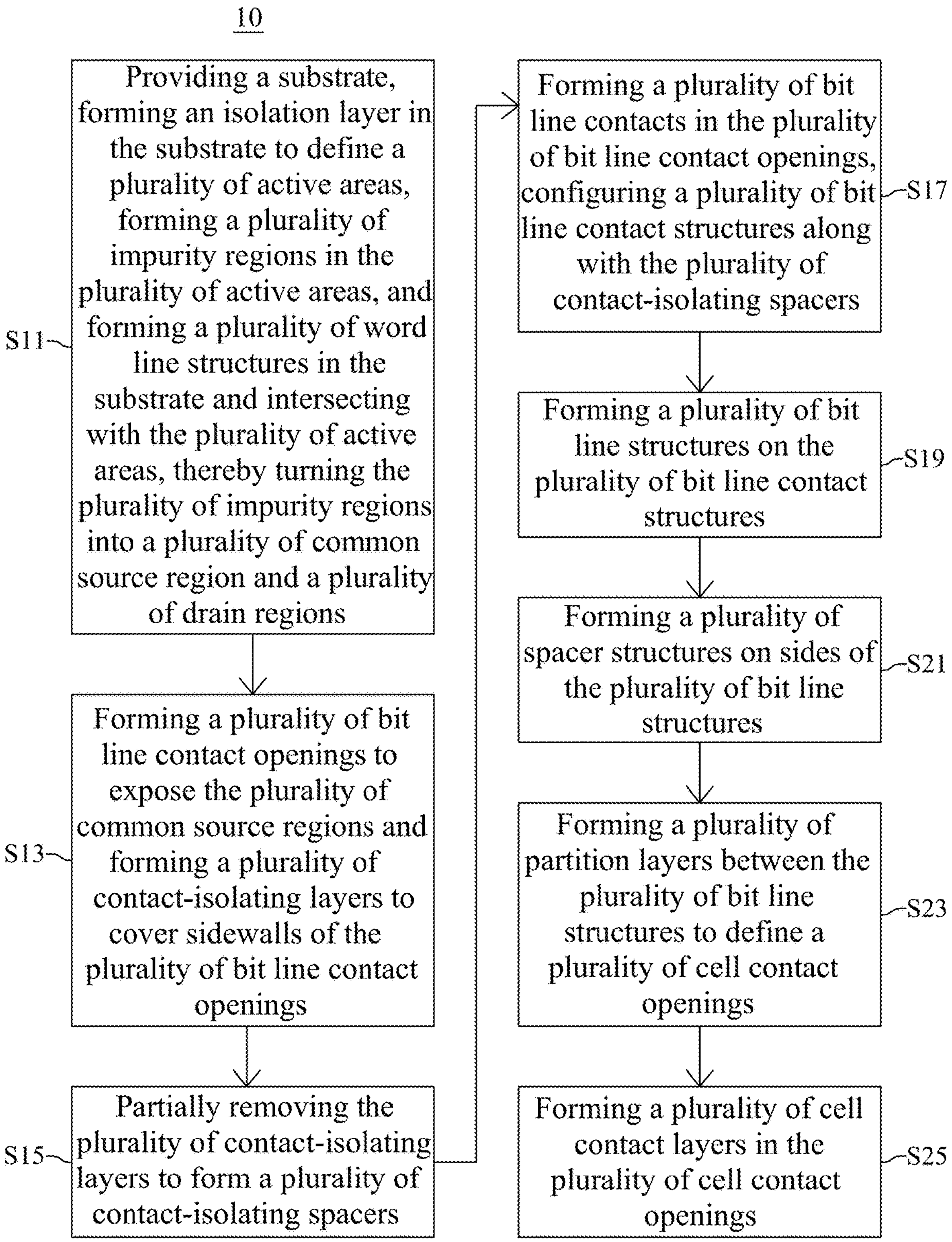
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being “connected to” or “coupled to” another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
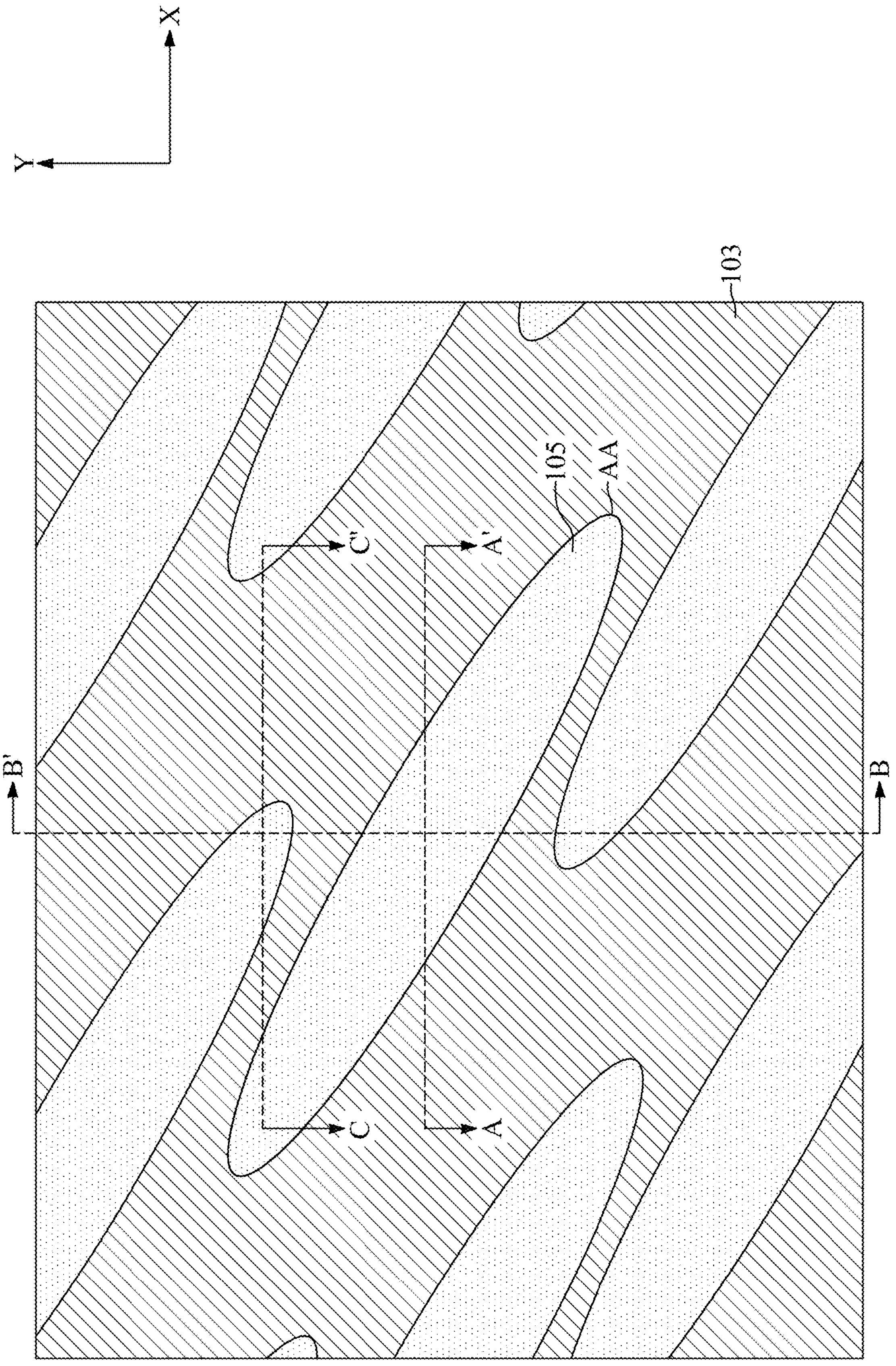
FIG. 2 illustrates, in a schematic top-view diagram, an intermediate semiconductor device in accordance with one embodiment of the present disclosure.
Figure 3:
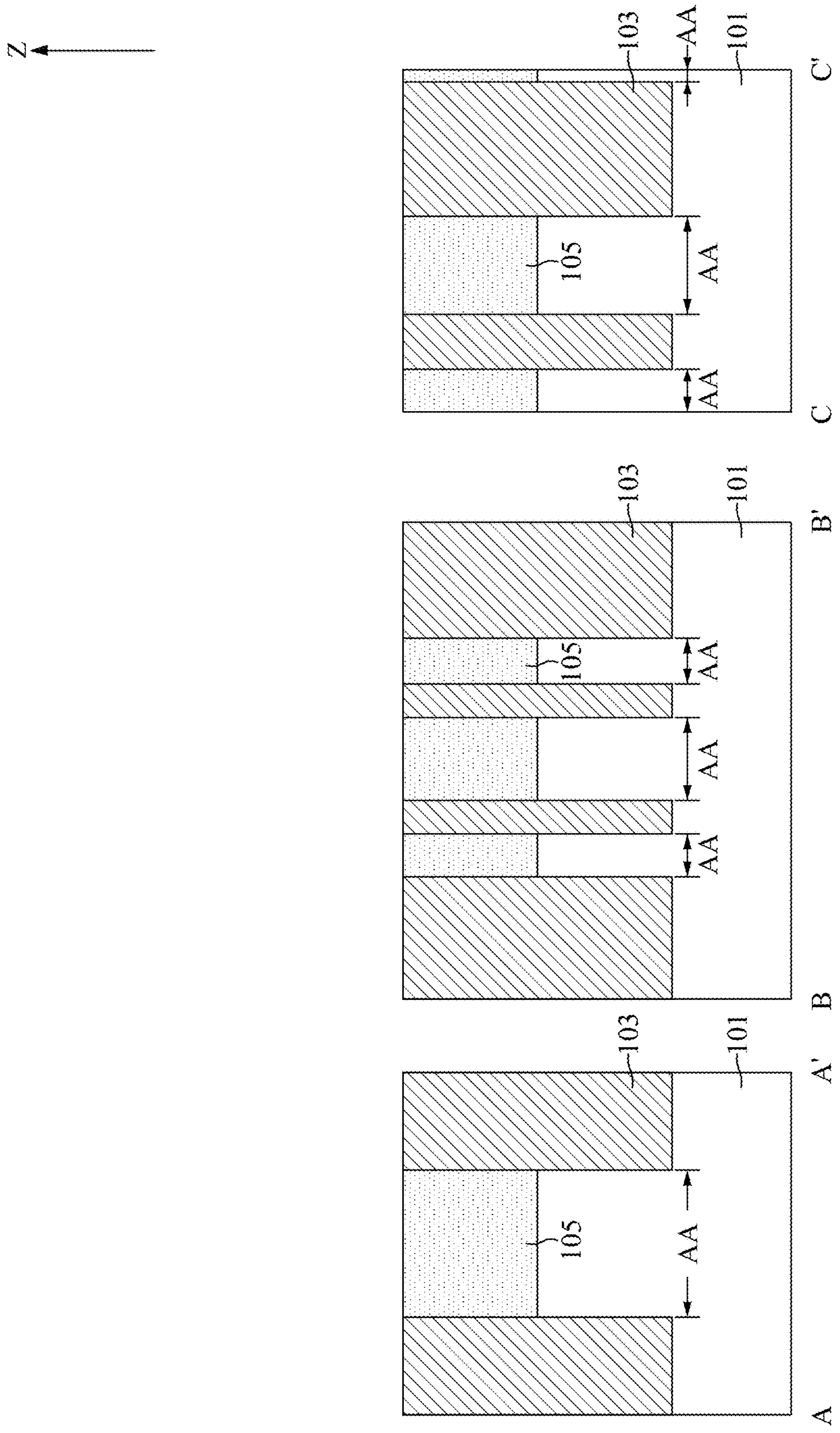
FIGS. 3 and 4 are schematic cross-sectional view diagrams taken along lines A-A', B-B', and C-C' in FIG. 2 illustrating part of a flow for fabricating the semiconductor device in accordance with one embodiment of the present disclosure.
Figure 4:
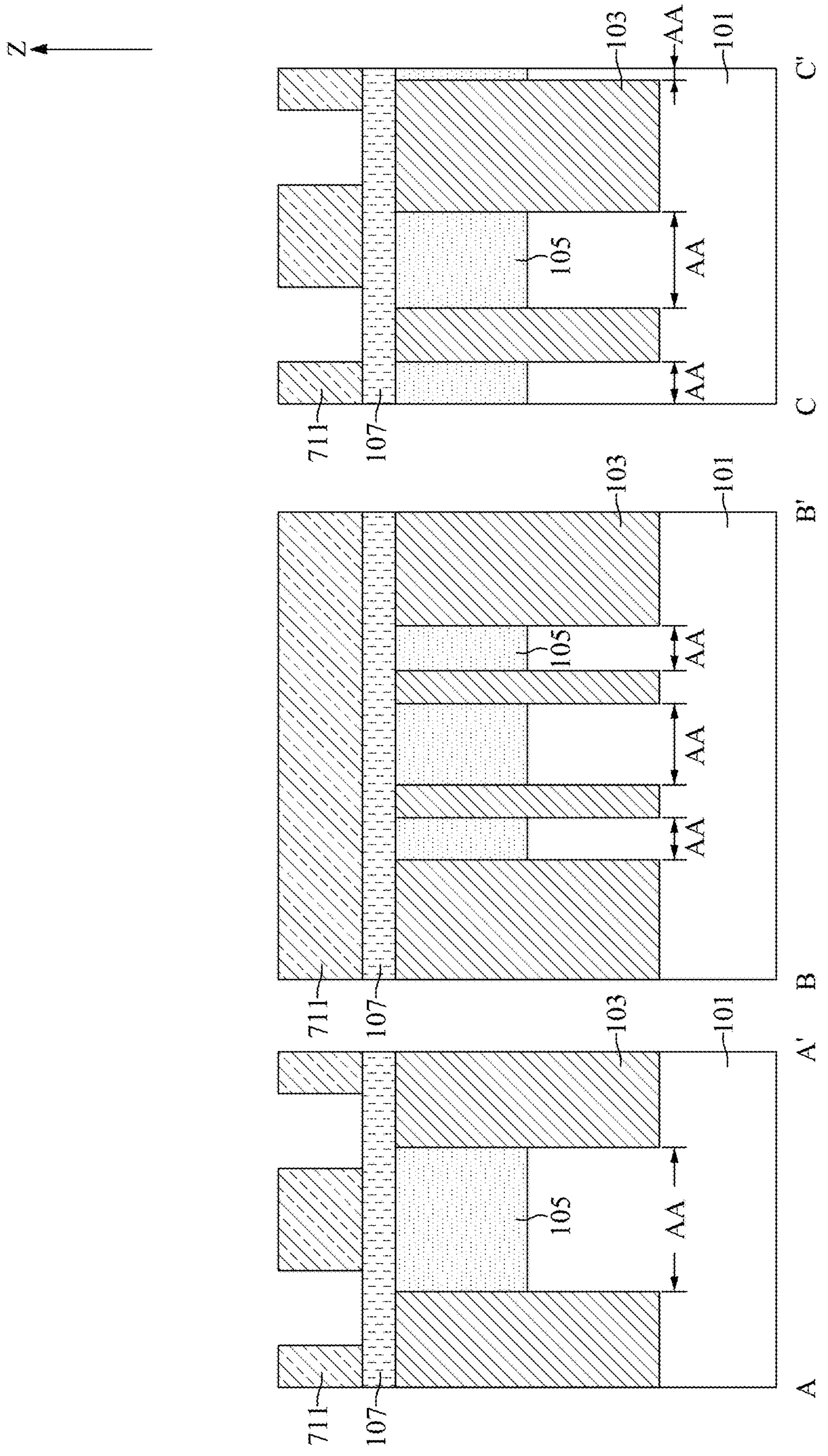
Figure 5:
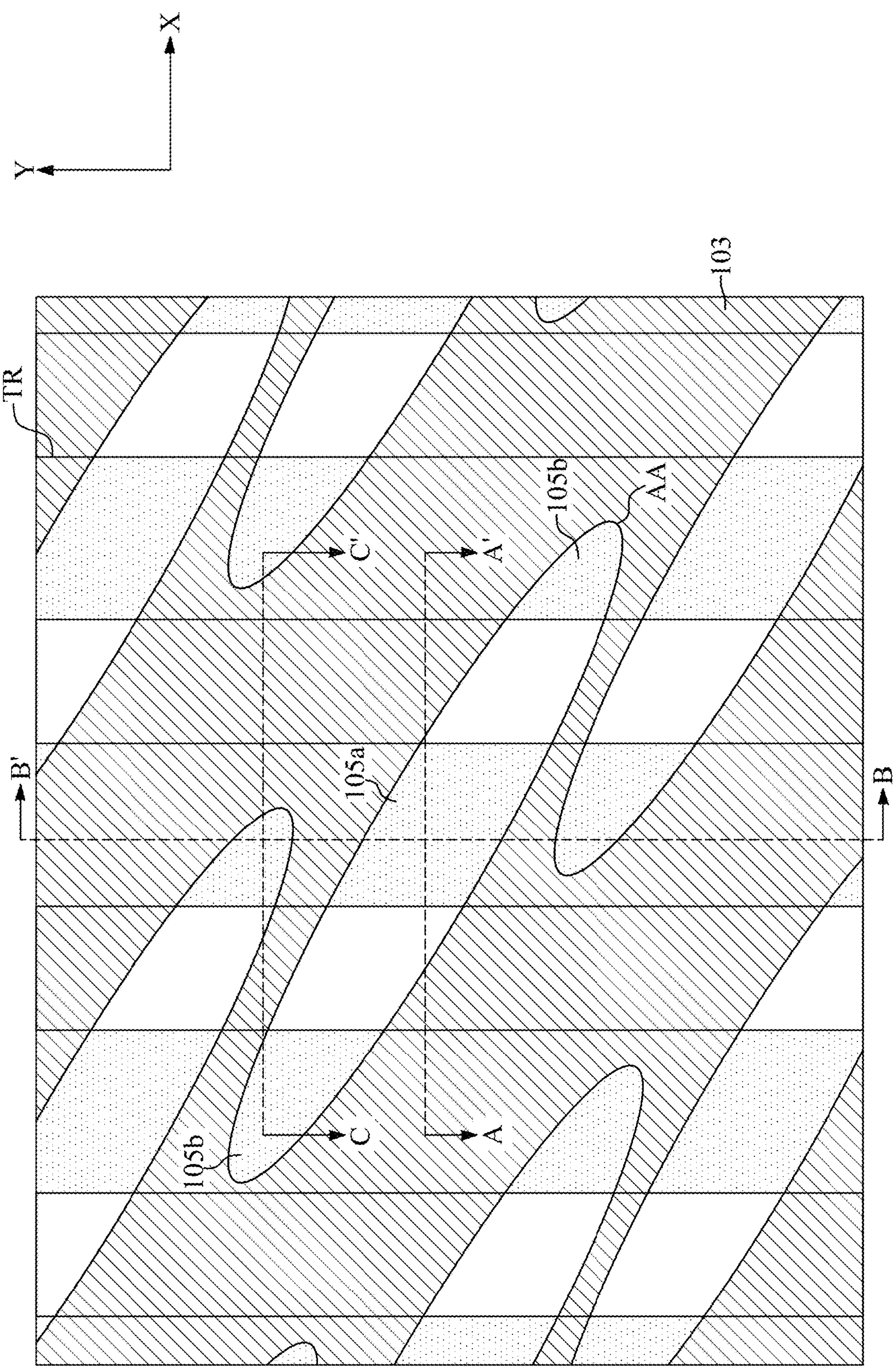
FIG. 5 illustrates, in a schematic top-view diagram, an intermediate semiconductor device in accordance with one embodiment of the present disclosure.
Figure 6:
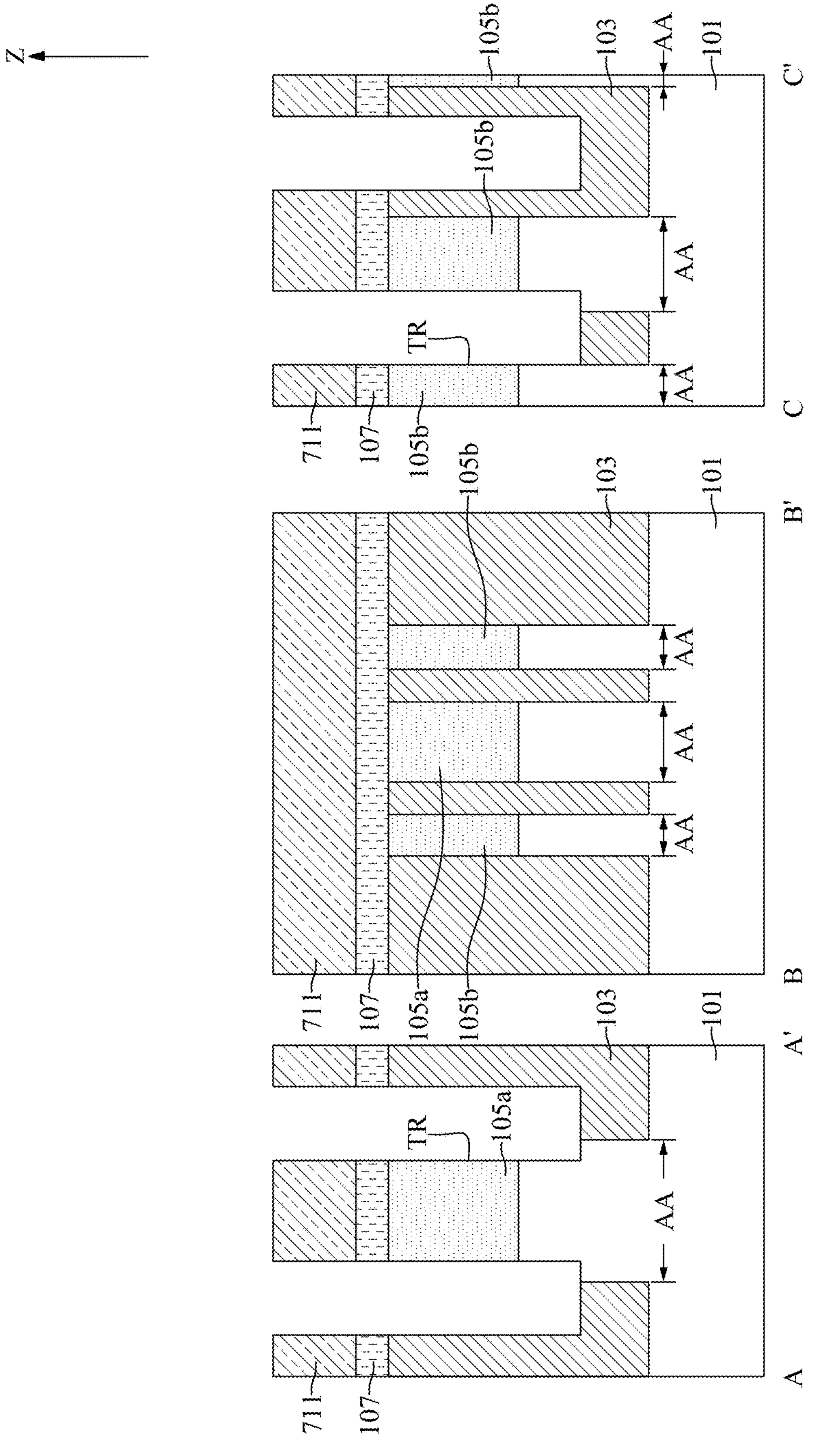
FIGS. 6 to 8 are schematic cross-sectional view diagrams taken along lines A-A', B-B', and C-C' in FIG. 5 illustrating part of the flow for fabricating the semiconductor device in accordance with one embodiment of the present disclosure.
Figure 7:
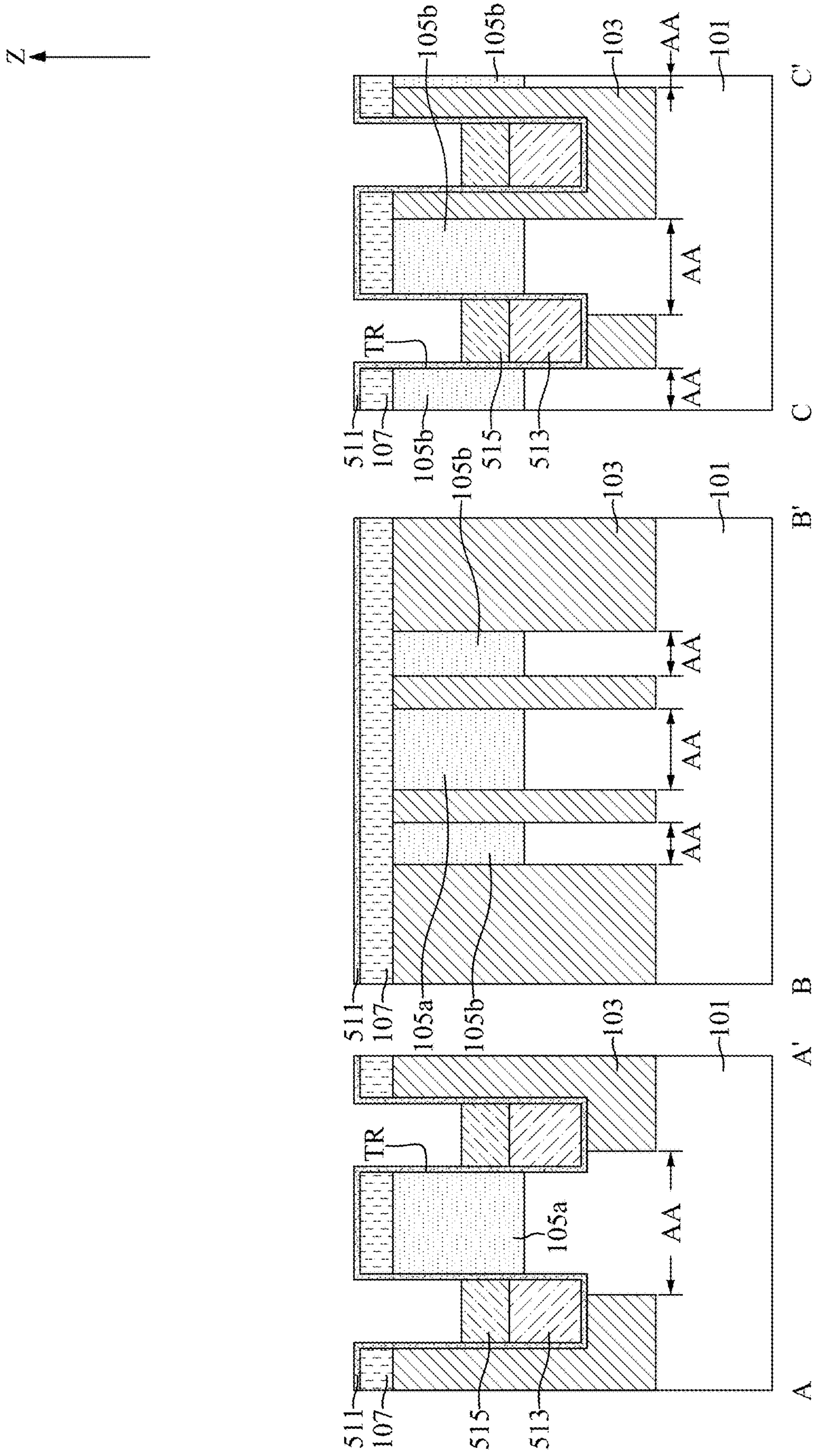
Figure 8:
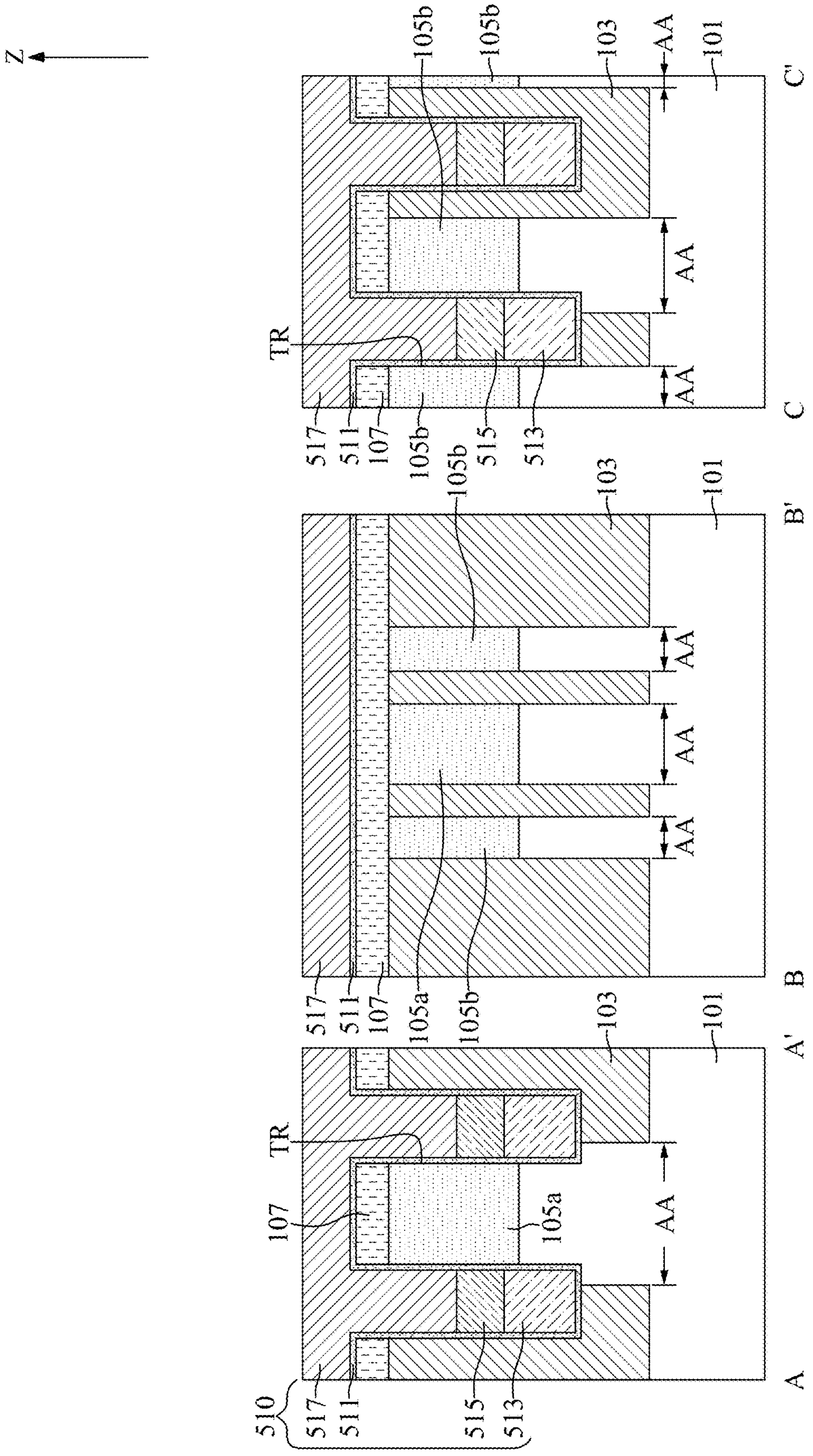

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIGS. 3 and 4 are schematic cross-sectional view diagrams taken along lines A-A', B-B', and C-C' in FIG. 2 illustrating part of a flow for fabricating the semiconductor device 1A in accordance with one embodiment of the present disclosure. FIG. 5 illustrates, in a schematic top-view diagram, an intermediate semiconductor device in accordance with one embodiment of the present disclosure. FIGS. 6 to 8 are schematic cross-sectional view diagrams taken along lines A-A', B-B', and C-C' in FIG. 5 illustrating part of the flow for fabricating the semiconductor device 1A in accordance with one embodiment of the present disclosure.

With reference to FIGS. 1 to 8, at step S11, a substrate 101 may be provided, an isolation layer 103 may be formed in the substrate 101 to define a plurality of active areas AA, a plurality of impurity regions 105 may be formed in the plurality of active areas AA, and a plurality of word line structures 510 may be formed in the substrate 101 and intersecting with the plurality of active areas AA, thereby turning the plurality of impurity regions 105 into a plurality of common source region 105*a* and a plurality of drain regions 105*b*.

With reference to FIGS. 2 and 3, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, the isolation layer 103 may be formed in the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface of the substrate 101 is exposed to remove excess filling material, provide a substantially flat surface for subsequent processing steps, and concurrently form the isolation layer 103. The insulating material may be, for example, silicon oxide or other applicable insulating materials. The isolation layer 103 may define the plurality of active areas AA in the substrate 101.

It should be noted that, in the description of the present disclosure, a surface of an element (or a feature) located at the highest vertical level along the Z axis is referred to as a top surface of the element (or the feature). A surface of an element (or a feature) located at the lowest vertical level along the Z axis is referred to as a bottom surface of the element (or the feature).

It should be noted that each of the plurality of active areas AA may comprise a portion of the substrate 101 and a space above the portion of the substrate 101. Describing an element as being disposed on the active area AA means that the element is disposed on a top surface of the portion of the substrate 101. Describing an element as being disposed in the active area AA means that the element is disposed in the portion of the substrate 101; however, a top surface of the element may be even with the top surface of the portion of the substrate 101. Describing an element as being disposed above the active area AA means that the element is disposed above the top surface of the portion of the substrate 101.

With reference to FIGS. 2 and 3, a plurality of impurity regions 105 may be formed in the plurality of active areas AA, respectively and correspondingly. In some embodiments, the plurality of impurity regions 105 may be formed by an implantation process. That is, the plurality of impurity regions 105 may be turned from portions of the plurality of active areas AA. The dopants of the implantation process may include p-type impurities (dopants) or n-type impurities (dopants). The p-type impurities may be added to an intrinsic semiconductor to create deficiencies of valence electrons. In a silicon-containing substrate, examples of p-type dopants, i.e., impurities include but are not limited to boron, aluminum, gallium, and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic, and phosphorus. In some embodiments, the dopant concentration of the plurality of impurity regions 105 may be between about 1E19 atoms/cm^3 and about 1E21 atoms/cm^3. After the implantation process, the plurality of impurity regions 105 may have an electrical type such as n-type or p-type.

With reference to FIG. 4, a bottom insulating layer 107 may be formed on the substrate 101 and the isolation layer 103. In some embodiments, the bottom insulating layer 107 may be formed of a material having etching selectivity to the substrate 101 and the isolation layer 103. In some embodiments, the bottom insulating layer 107 may be formed of, for example, silicon nitride, boron nitride, silicon boron nitride, phosphorus boron nitride, boron carbon silicon nitride, or a combination thereof. In some embodiments, the bottom insulating layer 107 may be formed of, for example, silicon nitride. In some embodiments, the bottom insulating layer 107 may be formed by, for example, chemical vapor deposition, plasma-enhanced chemical vapor deposition, or other applicable deposition processes.

With reference to FIG. 4, a first mask layer 711 may be formed on the bottom insulating layer 107. In some embodiments, the first mask layer 711 may be a photoresist layer and may include a pattern of the plurality of word line structures 510.

It should be noted that the bottom insulating layer 107 is not shown in FIG. 5 for clarity.

With reference to FIGS. 5 and 6, an etching process using the first mask layer 711 as the mask may be performed to form a plurality of word line trenches TR in the substrate 101. In some embodiments, the plurality of word line trenches TR may have a line-shaped cross-sectional profile, extend along the direction Y, and travers (or intersect) with the plurality of impurity regions 105 in a top-view perspective. For example, each impurity region 105 may be intersected with two word line trenches TR. The plurality of word line trenches TR may divide each of the plurality of impurity regions 105 into a plurality of common source regions 105*a* and a plurality of drain regions 105*b*. For one impurity region 105, one common source region 105*a* may be formed between the two word line trenches TR and two drain regions 105*b* may be respectively and correspondingly formed between the isolation layer 103 and the two word line trenches TR.

With reference to FIG. 7, a word line dielectric layer 511 may be conformally formed on the inner surface of the word line trench TR and on the top surface of the bottom insulating layer 107. The word line dielectric layer 511 may have a U-shaped cross-sectional profile within the word line trench TR. In some embodiments, the word line dielectric layer 511 may be formed by a thermal oxidation process. For example, the word line dielectric layer 511 may be formed by oxidizing the inner surface of the word line trench TR. In some embodiments, the word line dielectric layer 511 may be formed by a deposition process such as a chemical vapor deposition or an atomic layer deposition. The word line dielectric layer 511 may include a high-k material, an oxide, a nitride, an oxynitride or combinations thereof. In some embodiments, after a liner polysilicon layer (not shown for clarity) is deposited, the word line dielectric layer 511 may be formed by radical-oxidizing the liner polysilicon layer. In some embodiments, after a liner silicon nitride layer (not shown for clarity) is formed, the word line dielectric layer 511 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

With reference to FIG. 7, a plurality of word line bottom conductive layers 513 may be formed on the word line dielectric layer 511 and within the plurality of word line trenches TR, respectively and correspondingly. In some embodiments, in order to form the plurality of word line bottom conductive layers 513, a conductive layer (not shown for clarity) may be formed to fill the plurality of word line trenches TR, and a recessing process may be subsequently performed. The recessing process may be performed as an etching back process or sequentially performed as the planarization process and an etching back process. The plurality of word line bottom conductive layers 513 may have a recessed shape that partially fills the plurality of word line trenches TR. That is, the top surface of the plurality of word line bottom conductive layers 513 may be lower than the top surface of the substrate 101.

In some embodiments, the plurality of word line bottom conductive layers 513 may include a metal, a metal nitride, or a combination thereof. For example, the plurality of word line bottom conductive layers 513 may be formed of titanium nitride, tungsten, or a titanium nitride/tungsten. After the titanium nitride is conformally formed, the titanium nitride/tungsten may have structures where the plurality of word line trenches TR are partially filled using tungsten. The titanium nitride or the tungsten may be solely used for the plurality of word line bottom conductive layers 513. In some embodiments, the plurality of word line bottom conductive layers 513 may be formed of, for example, a conductive material such as doped polycrystalline silicon, doped polycrystalline silicon germanium, or a combination thereof. In some embodiments, the plurality of word line bottom conductive layers 513 may be formed of, for example, tungsten, aluminum, titanium, copper, the like, or a combination thereof.

With reference to FIG. 7, a plurality of word line top conductive layers 515 may be formed on the plurality of word line bottom conductive layers 513 and within the plurality of word line trenches TR, respectively and correspondingly. In some embodiments, in order to form the plurality of word line top conductive layers 515, a conductive layer (not shown for clarity) may be formed to fill the plurality of word line trenches TR, and a recessing process may be subsequently performed. The recessing process may be performed as an etching back process or sequentially performed as the planarization process and an etching back process. The plurality of word line top conductive layers 515 may have a recessed shape that partially fills the plurality of word line trenches TR. That is, the top surface of the plurality of word line bottom conductive layers 513 may be lower than the top surface of the substrate 101.

In some embodiments, the plurality of word line top conductive layers 515 may include for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the plurality of word line top conductive layers 515 may be doped with p-type dopants or n-type dopants. In some embodiments, doping may be performed by incorporating the dopants during the deposition process for forming the conductive layer.

With reference to FIG. 8, a dielectric material may be deposited by, for example chemical vapor deposition, to completely fill the plurality of word line trenches TR and covering the top surface of the bottom insulating layer 107. A planarization process, such as chemical mechanical polishing, may be performed to provide a substantially flat surface for subsequent processing steps and form a word line capping layer 517. In some embodiments, the word line capping layer 517 may include, for example, silicon nitride, or other applicable dielectric material. The word line dielectric layer 511, the plurality of word line bottom conductive layers 513, the plurality of word line top conductive layers 515, and the word line capping layer 517 together configure the plurality of word line structures 510. The plurality of word line structures 510 may separate the plurality of common source regions 105*a* from the plurality of drain regions 105*b*, respectively and correspondingly.

Figure 9:
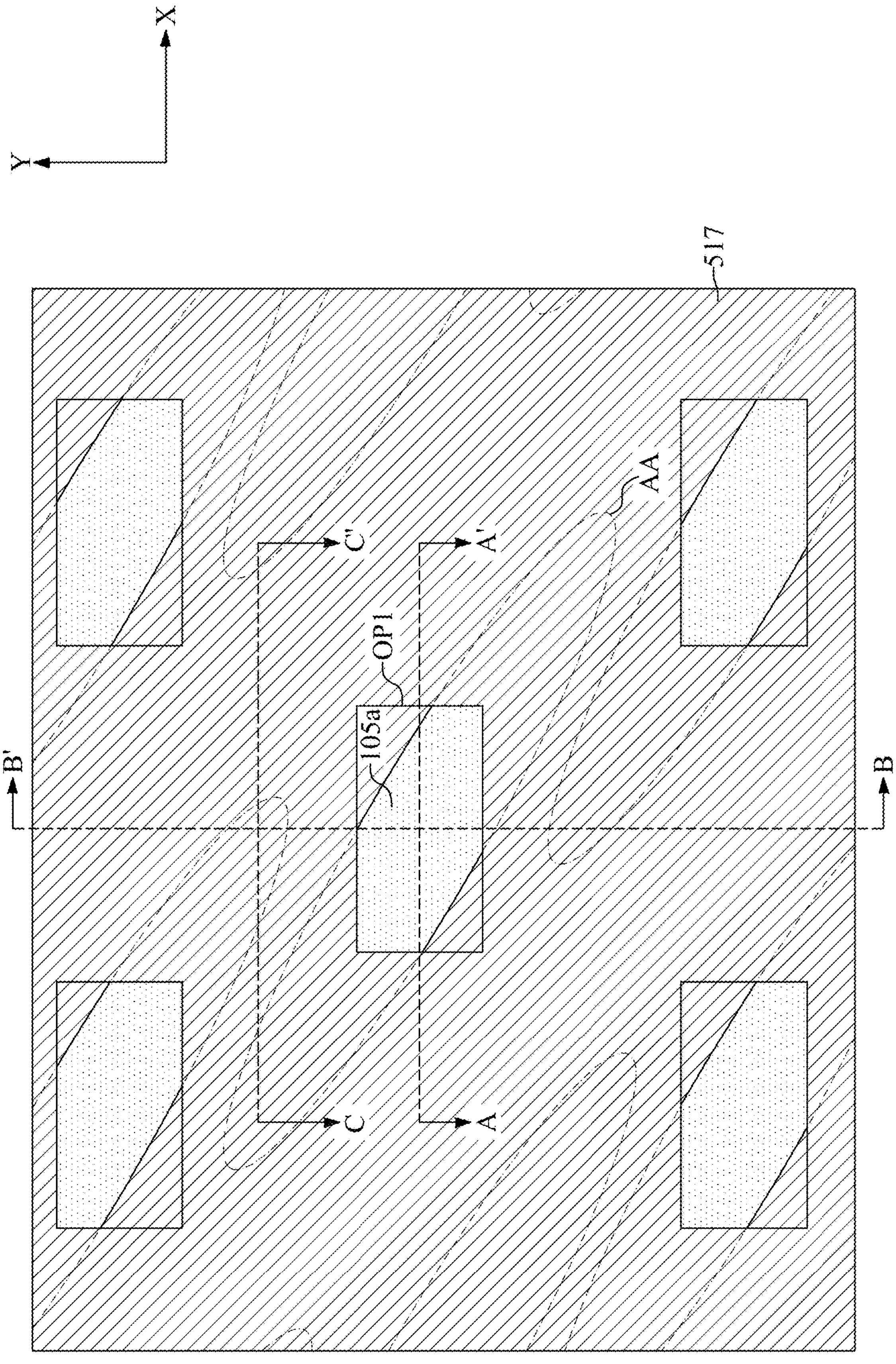
FIG. 9 illustrates, in a schematic top-view diagram, an intermediate semiconductor device in accordance with one embodiment of the present disclosure.
Figure 10:
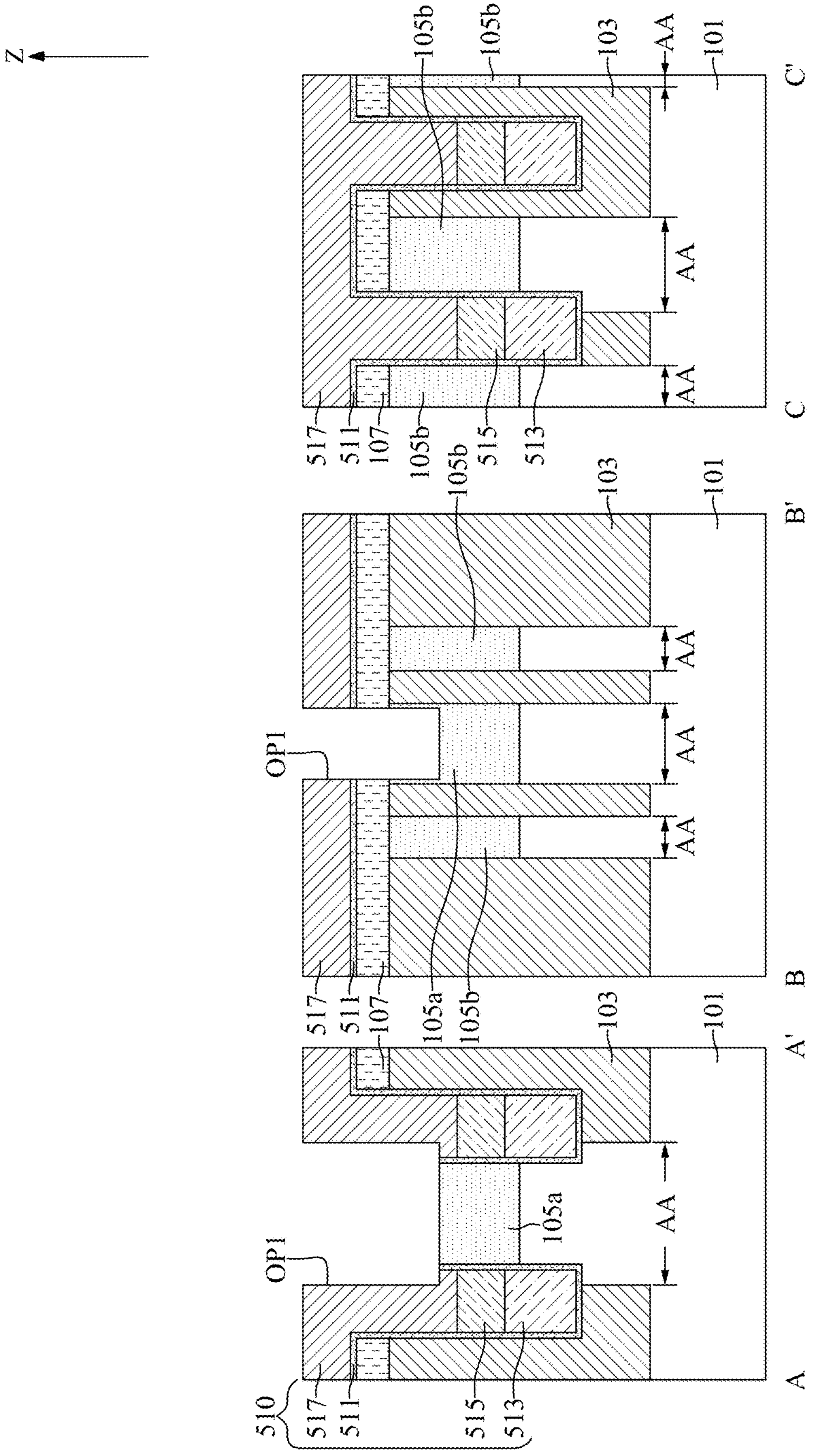
FIGS. 10 and 11 are schematic cross-sectional view diagrams taken along lines A-A', B-B', and C-C' in FIG. 9 illustrating part of the flow for fabricating the semiconductor device in accordance with one embodiment of the present disclosure.
Figure 11:
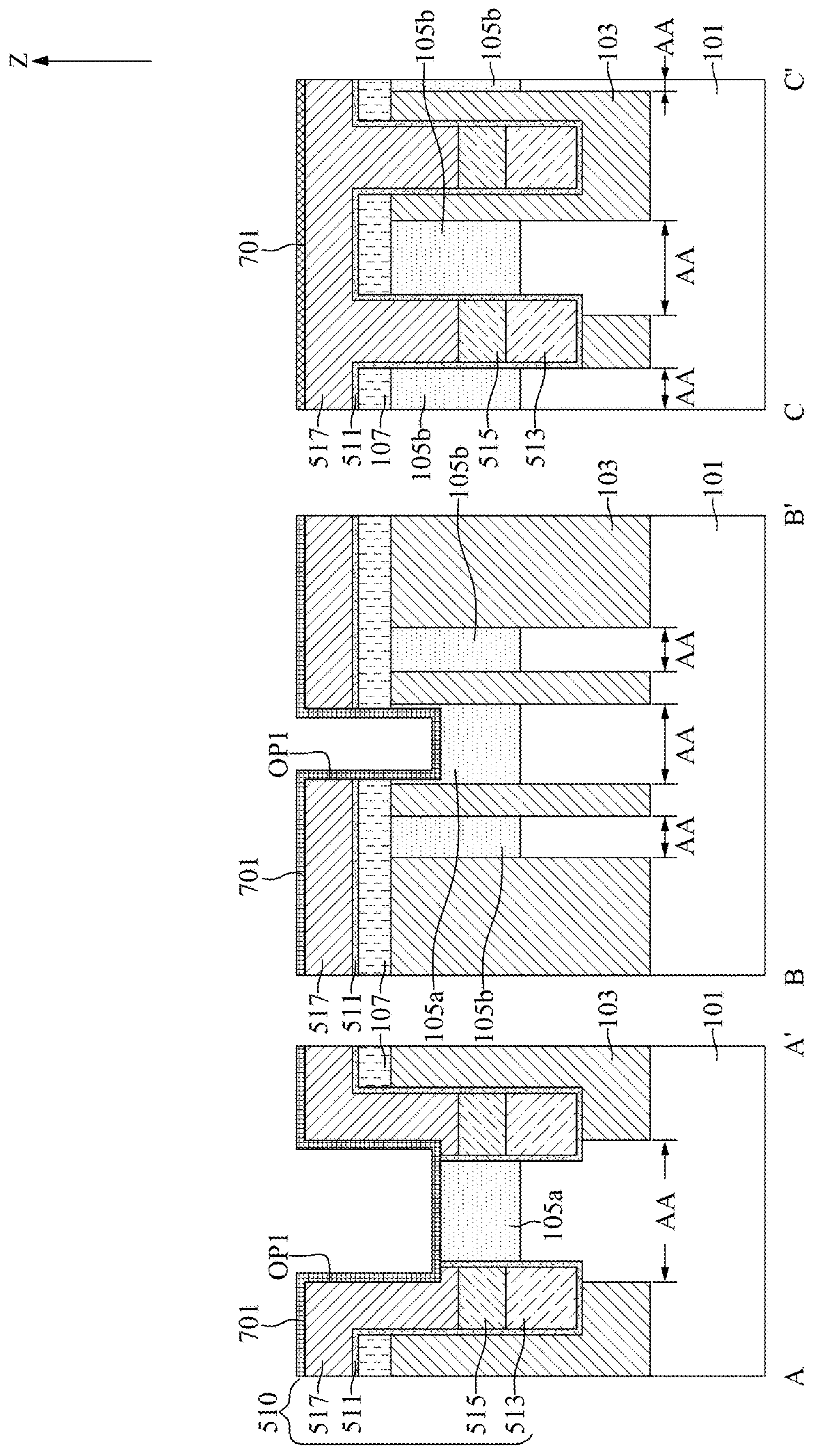
Figure 12:
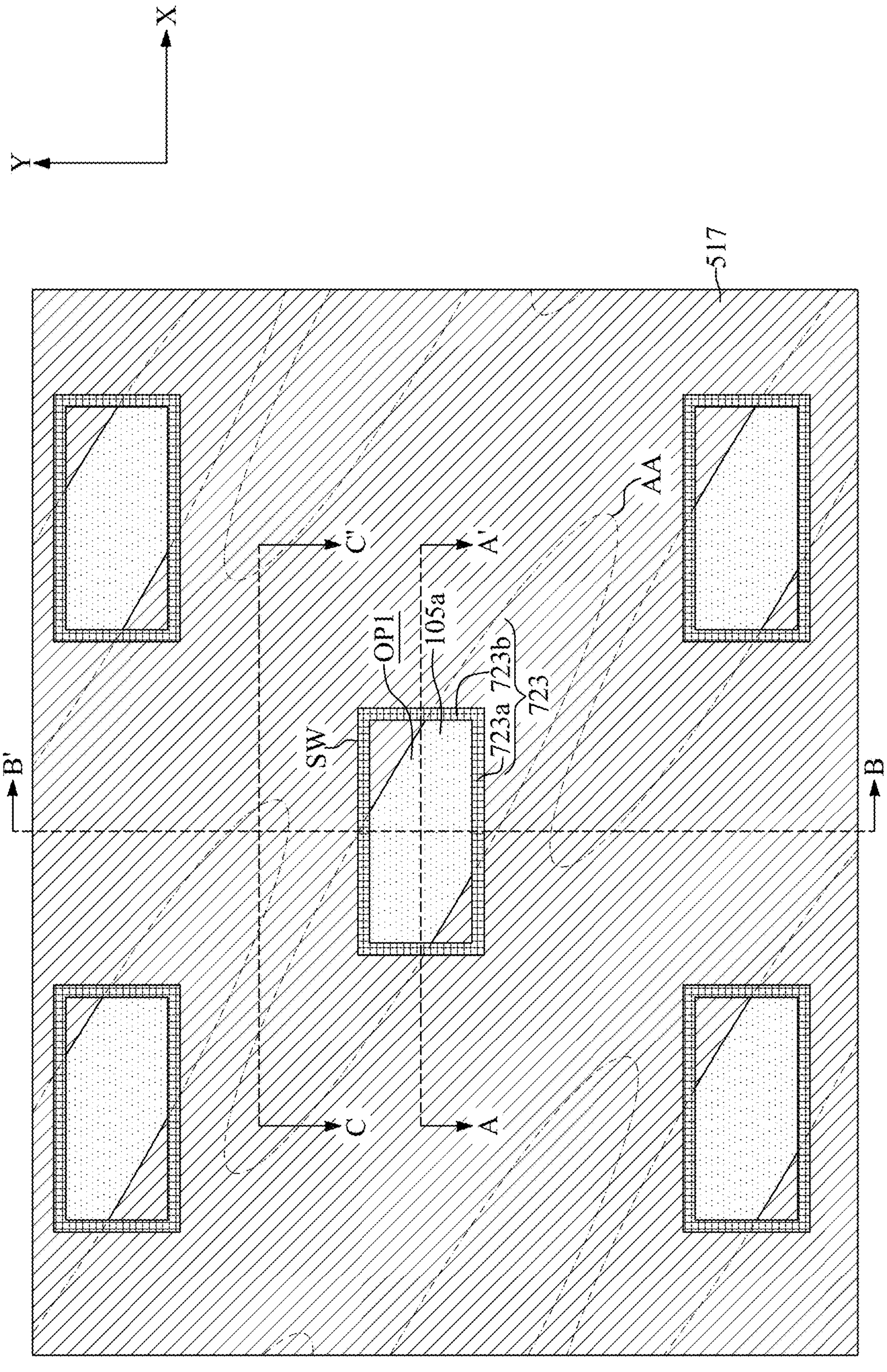
FIG. 12 illustrates, in a schematic top-view diagram, an intermediate semiconductor device in accordance with one embodiment of the present disclosure.
Figure 13:
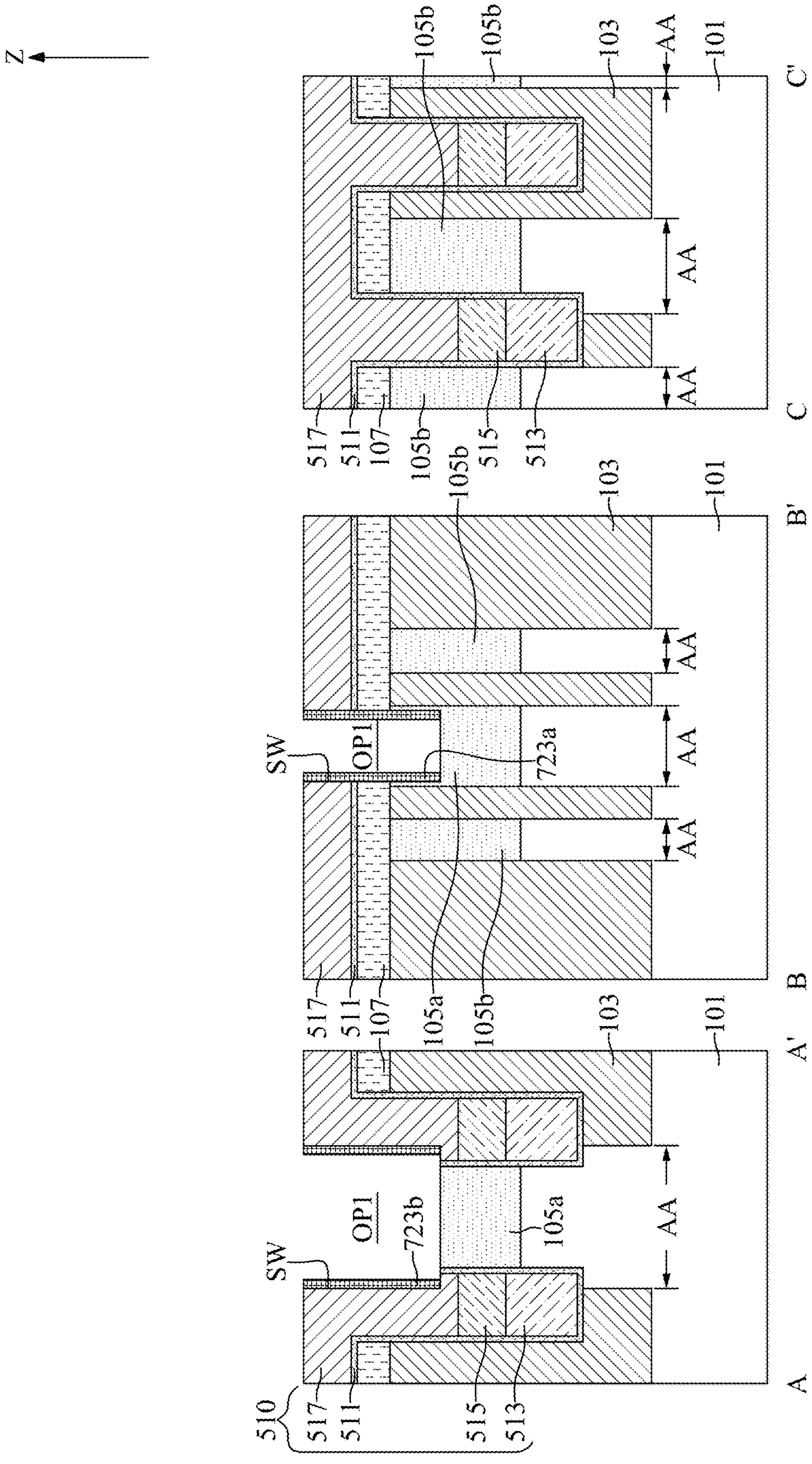
FIG. 13 is a schematic cross-sectional view diagram taken along lines A-A', B-B', and C-C' in FIG. 12.

FIG. 9 illustrates, in a schematic top-view diagram, an intermediate semiconductor device in accordance with one embodiment of the present disclosure. FIGS. 10 and 11 are schematic cross-sectional view diagrams taken along lines A-A', B-B', and C-C' in FIG. 9 illustrating part of the flow for fabricating the semiconductor device 1A in accordance with one embodiment of the present disclosure. FIG. 12 illustrates, in a schematic top-view diagram, an intermediate semiconductor device in accordance with one embodiment of the present disclosure. FIG. 13 is a schematic cross-sectional view diagram taken along lines A-A', B-B', and C-C' in FIG. 12.

With reference to FIG. 1 and FIGS. 9 to 13, at step S13, a plurality of bit line contact openings OP1 may be formed to expose the plurality of common source regions 105*a* and a plurality of contact-isolating layers 723 may be formed to cover sidewalls SW of the plurality of bit line contact openings OP1.

With reference to FIGS. 9 and 10, the plurality of bit line contact openings OP1 may be formed by a photolithography process and a subsequent etching process. The bit line contact opening OP1 may penetrate the word line capping layer 517, the word line dielectric layer 511, and the bottom insulating layer 107 and extend to the substrate 101. The common source region 105*a* may be exposed through the bit line contact opening OP1. In some embodiments, the bit line contact opening OP1 may have a rectangular or square cross-sectional profile in a top-view perspective.

With reference to FIG. 11, a layer of first insulating material 701 may be conformally formed within the plurality of bit line contact openings OP1 and on the top surface of the word line capping layer 517. In some embodiments, the first insulating material 701 may include, for example, a material having etching selectivity to the substrate 101. In some embodiments, the first insulating material 701 may include, for example, silicon nitride or other applicable insulating materials. In some embodiments, the layer of first insulating material 701 may be formed by, for example, atomic layer deposition, chemical vapor deposition, or other applicable deposition processes.

With reference to FIGS. 12 and 13, an etching process may be performed to remove the first insulating material 701 formed on the common source region 105*a*. In some embodiments, the etching process may be an anisotropic etching process. For example, the etching process may be an anisotropic dry etching process. After the etching process, the remaining first insulating material 701 on the sidewalls SW of the plurality of bit line contact openings OP1 may be referred to as the plurality of contact-isolating layers 723.

With reference to FIGS. 12 and 13, each of the plurality of contact-isolating layers 723 may include two first portions 723*a* and two second portions 723*b*. In a top-view perspective, the two first portions 723*a* may be parallel to each other and extend along the direction X. The two second portions 723*b* may be parallel to each other and extend along the direction Y. The first portions 723*a* and the second portions 723*b* together configure a rectangular ring or square-ring cross sectional profile in a top-view perspective.

Figure 14:
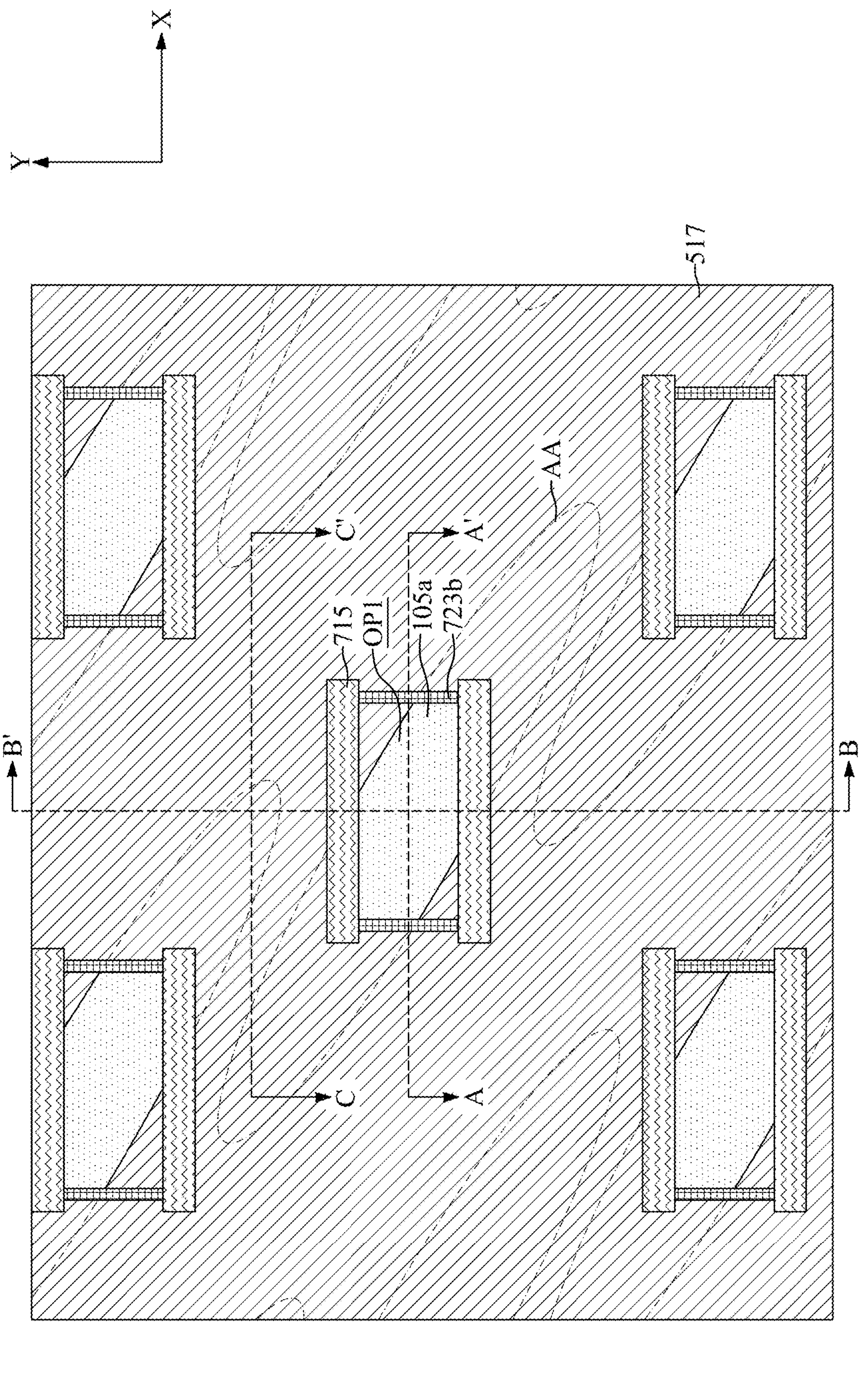
FIG. 14 illustrates, in a schematic top-view diagram, an intermediate semiconductor device in accordance with one embodiment of the present disclosure.
Figure 15:
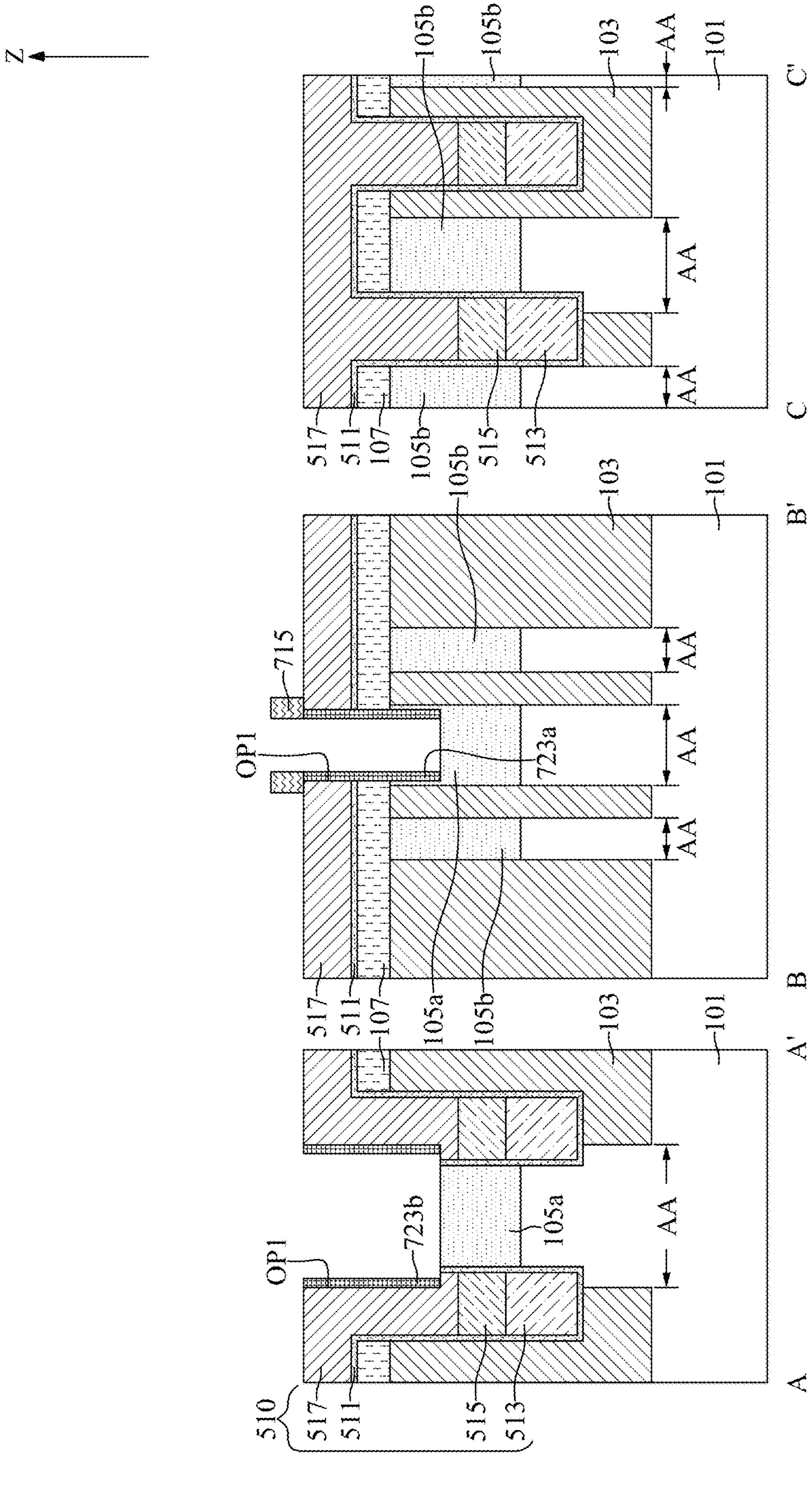
FIGS. 15 and 16 are schematic cross-sectional view diagrams taken along lines A-A', B-B', and C-C' in FIG. 14 illustrating part of the flow for fabricating the semiconductor device in accordance with one embodiment of the present disclosure.
Figure 16:
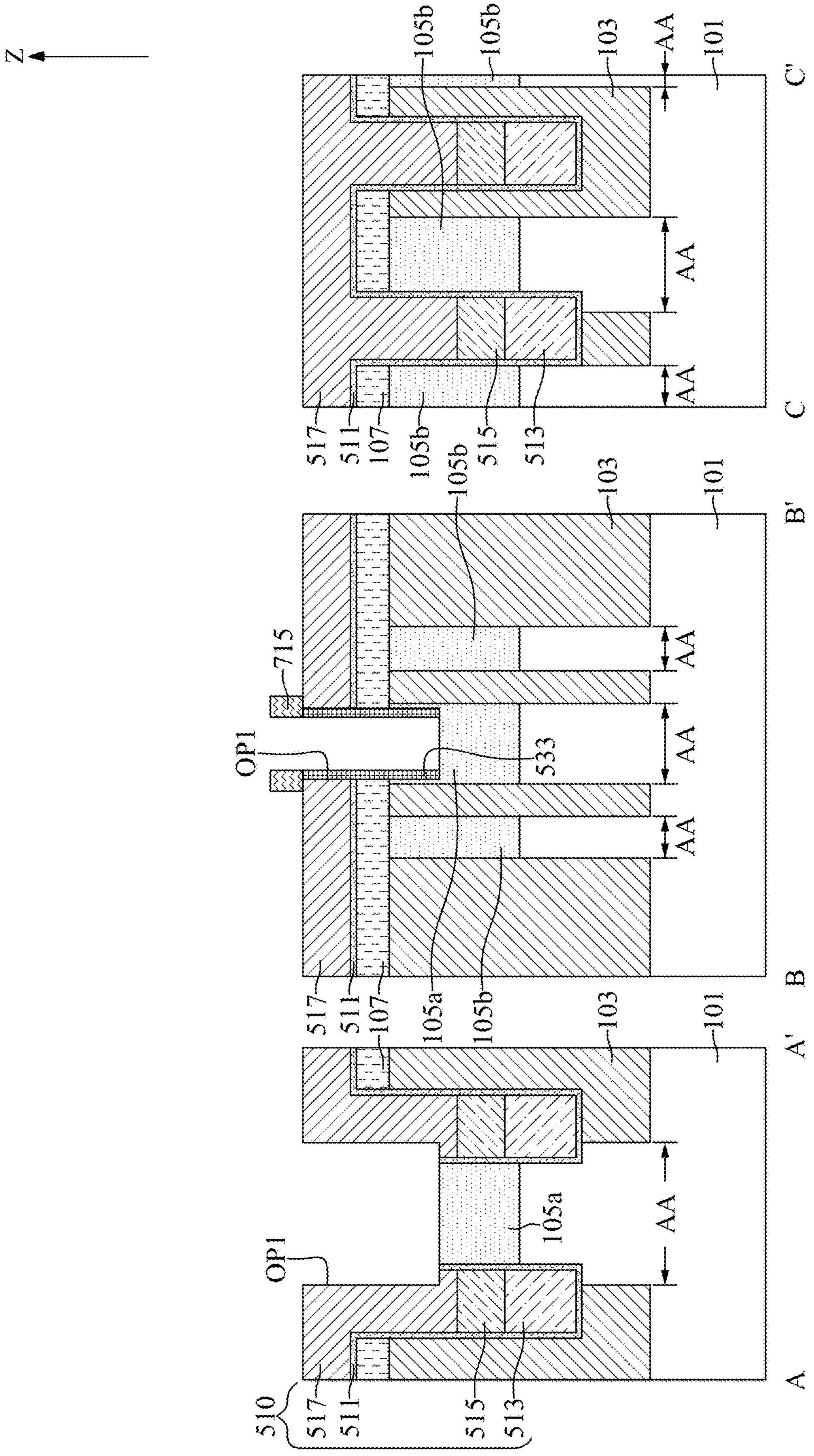
Figure 17:
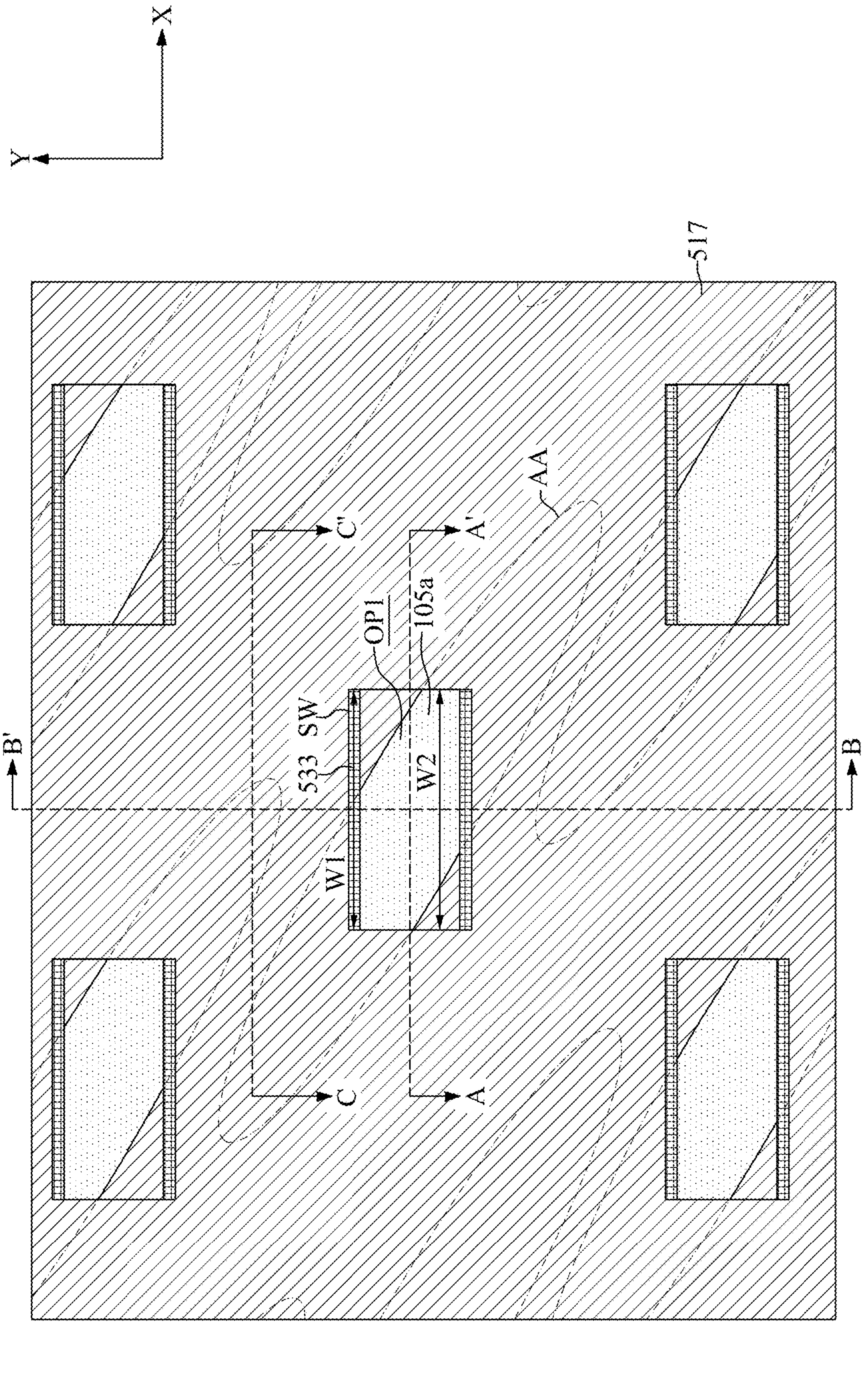
FIG. 17 illustrates, in a schematic top-view diagram, an intermediate semiconductor device in accordance with one embodiment of the present disclosure.
Figure 18:
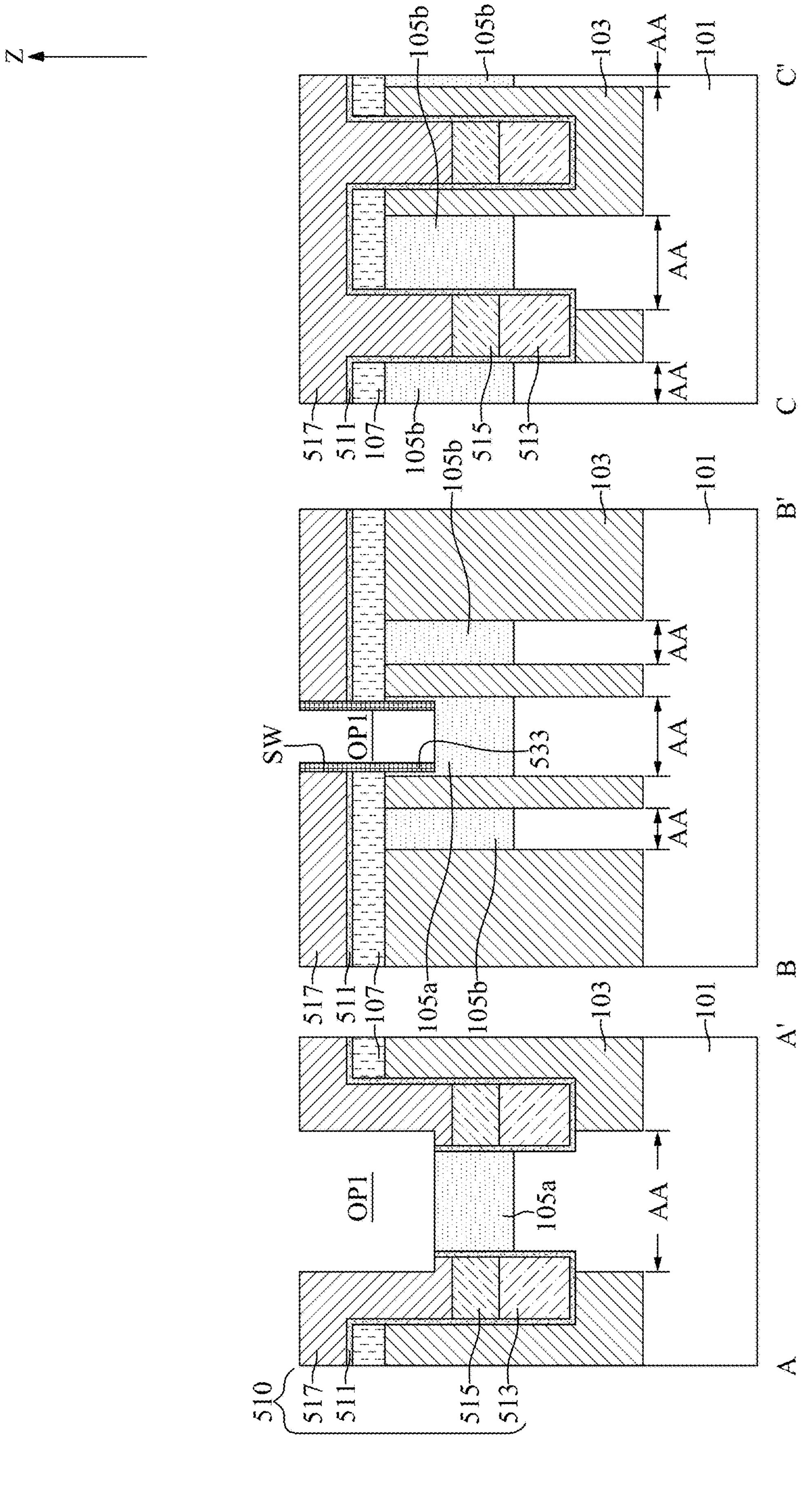
FIG. 18 is a schematic cross-sectional view diagram taken along lines A-A', B-B', and C-C' in FIG. 17.

FIG. 14 illustrates, in a schematic top-view diagram, an intermediate semiconductor device in accordance with one embodiment of the present disclosure. FIGS. 15 and 16 are schematic cross-sectional view diagrams taken along lines A-A', B-B', and C-C' in FIG. 14 illustrating part of the flow for fabricating the semiconductor device 1A in accordance with one embodiment of the present disclosure. FIG. 17 illustrates, in a schematic top-view diagram, an intermediate semiconductor device in accordance with one embodiment of the present disclosure. FIG. 18 is a schematic cross-sectional view diagram taken along lines A-A', B-B', and C-C' in FIG. 17.

With reference to FIG. 1 and FIGS. 14 to 18, at step S15, the plurality of contact-isolating layers 723 may be partially removed to form a plurality of contact-isolating spacers 533.

With reference to FIGS. 14 and 15, a plurality of hard mask layers 715 may be formed on the word line capping layer 517 to selectively mask the first portions 723*a*. In some embodiments, the plurality of hard mask layers 715 may include a material having etching selectivity to the word line capping layer 517 and the substrate 101. In some embodiments, the plurality of hard mask layers 715 may be formed of, for example, boron nitride, silicon boron nitride, phosphorus boron nitride, boron carbon silicon nitride, or the like. The plurality of hard mask layers 715 may be formed by a film formation process, a treatment process, and a subsequent photolithography process and etching process. Detailedly, in the film formation process, first precursors, which may be boron-based precursors, may be introduced over the pad oxide to form a boron-based layer. Subsequently, in the treatment process, second precursors, which may be nitrogen-based precursors, may be introduced to react with the boron-based layer and turn the boron-based layer into the plurality of hard mask layers 715. The pattern of the plurality of hard mask layers 715 may be defined by the photolithography process and etching process.

In some embodiments, the first precursors may be, for example, diborane, borazine, or an alkyl-substituted derivative of borazine. In some embodiments, the first precursors may be introduced at a flow rate between about 5 sccm and about 50 slm (standard liter per minute) or between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm or between about 1 slm and about 10 slm.

In some embodiments, the film formation process may be performed without an assistant of plasma. In such a situation, a substrate temperature of the film formation process may be between about 100°C and about 1000°C For example, the substrate temperature of the film formation process may be between about 300°C and about 500°C A process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such a situation, a substrate temperature of the film formation process may be between about 100°C and about 1000°C For example, the substrate temperature of the film formation process may be between about 300°C and about 500°C A process pressure of the film formation process may be between about 10 mTorr and about 760 Torr. For example, the process pressure of the film formation process may be between about 2 Torr and about 10 Torr. The plasma may be generated by a RF power between 2 W and 5000 W. For example, the RF power may be between 30 W and 1000 W.

In some embodiments, the second precursors may be, for example, ammonia or hydrazine. In some embodiments, the second precursors may be introduced at a flow rate between about 5 sccm and about 50 slm or between about 10 sccm and about 1 slm.

In some embodiments, oxygen-based precursors may be introduced together with the second precursors in the treatment process. The oxygen-based precursors may be, for example, oxygen, nitric oxide, nitrous oxide, carbon dioxide, or water.

In some embodiments, silicon-based precursors may be introduced together with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be introduced together with the second precursors in the treatment process. The phosphorus-based precursors may be, for example, phosphine.

In some embodiments, oxygen-based precursors, silicon-based precursors, or phosphorus-based precursors may be introduced together with the second precursors in the treatment process.

In some embodiments, the treatment process may be performed with an assistant of a plasma process, a UV cure process, a thermal anneal process, or a combination thereof.

When the treatment is performed with the assistance of the plasma process. Plasma of the plasma process may be generated by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency of greater than about 13.6 MHz. In such a situation, a substrate temperature of the treatment process may be between about 20°C and about 1000°C A process pressure of the treatment process may be between about 10 mTorr and about 760 Torr.

When the treatment is performed with the assistance of UV cure process, in such a situation, a substrate temperature of the treatment process may be between about 20°C and about 1000°C A process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV or between about 1 eV and about 6 eV. The assistance of the UV cure process may remove hydrogen from the plurality of hard mask layers 715. As hydrogen may diffuse through into other areas of the semiconductor device 1A and may degrade the reliability of the semiconductor device 1A, the removal of hydrogen by the assistant of UV cure process may improve the reliability of the semiconductor device 1A. In addition, the UV cure process may increase the density of the plurality of hard mask layers 715.

When the treatment is performed with the assistant of the thermal anneal process. In such a situation, a substrate temperature of the treatment process may be between about 20°C and about 1000°C A process pressure of the treatment process may be between about 10 mTorr and about 760 Torr.

The pattern of the plurality of hard mask layers 715 may be defined by the subsequent photolithography process and etching process.

In some alternative embodiments, the plurality of hard mask layers 715 may be photoresist layers.

With reference to FIG. 16, an etching process may be performed using the plurality of hard mask layers 715 as the mask to selectively remove the second portions 723*b*. In some embodiments, the etching process may be an anisotropic etching process such as an anisotropic dry etching process. The remaining first portions 723*a* may be referred to as the contact-isolating spacers 533.

With reference to FIGS. 17 and 18, the plurality of hard mask layers 715 may be removed. For each of the bit line contact opening OP1, two contact-isolating spacers 533 may be disposed on the sidewall SW of the bit line contact opening OP1, parallel to each other, and extending along the direction X in a top-view perspective. In some embodiments, the width W1 of the contact-isolating spacer 533 and the width W2 of the bit line contact opening OP1 may be substantially the same. In some embodiments, the W1 of the contact-isolating spacer 533 may be less than the width W2 of the bit line contact opening OP1. In some embodiments, the ratio of the W1 of the contact-isolating spacer 533 to the width W2 of the bit line contact opening OP1 may be between about 0.90 and 1.00 or between about 0.95 and 1.00.

Figure 19:
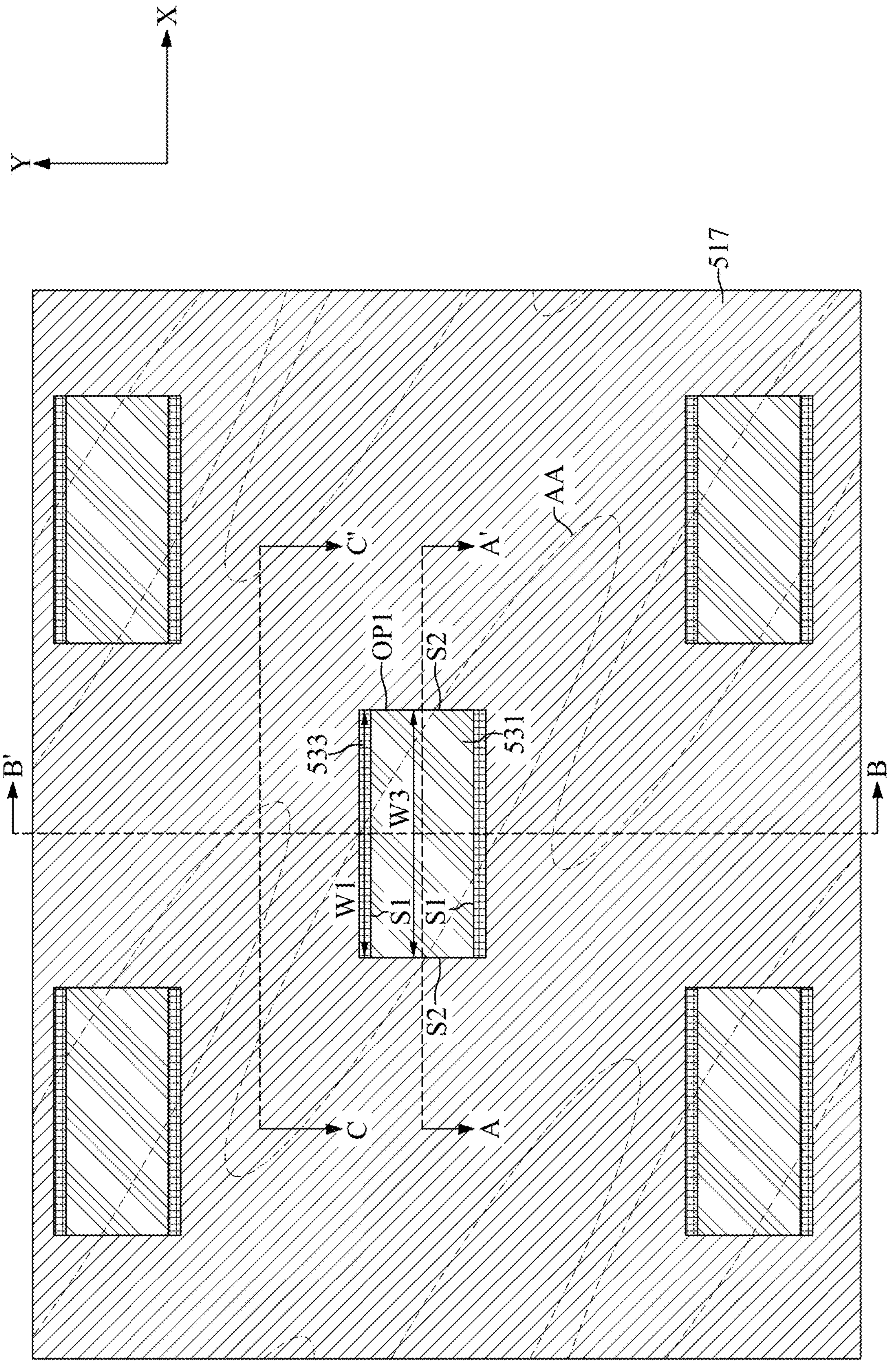
FIG. 19 illustrates, in a schematic top-view diagram, an intermediate semiconductor device in accordance with one embodiment of the present disclosure.
Figure 20:
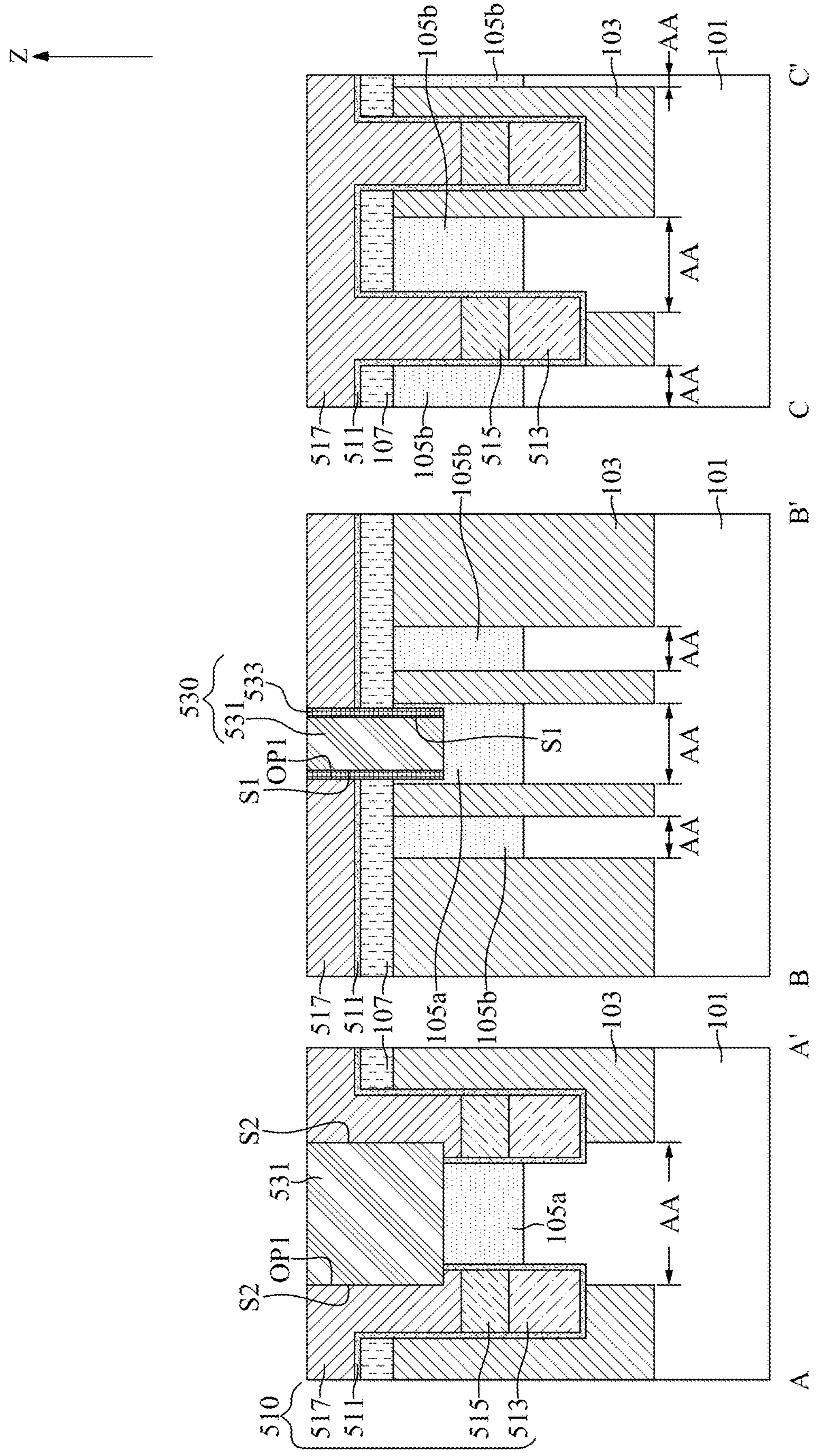
FIG. 20 is a schematic cross-sectional view diagram taken along lines A-A', B-B', and C-C' in FIG. 19.

FIG. 19 illustrates, in a schematic top-view diagram, an intermediate semiconductor device in accordance with one embodiment of the present disclosure. FIG. 20 is a schematic cross-sectional view diagram taken along lines A-A', B-B', and C-C' in FIG. 19.

With reference to FIG. 1 and FIGS. 19 and 20, at step S17, a plurality of bit line contacts 531 may be formed in the plurality of bit line contact openings OP1, configuring a plurality of bit line contact structures 530 along with the plurality of contact-isolating spacers 533.

With reference to FIGS. 19 and 20, a conductive material (not shown) may be formed to completely fill the plurality of bit line contact openings OP1. A planarization process, such as chemical mechanical polishing, may be performed until the top surface of the word line capping layer 517 is exposed to remove excess material, provide a substantially flat surface for subsequent processing steps, and concurrently form the plurality of bit line contacts 531. In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the conductive material may be formed by, for example, physical vapor deposition, chemical vapor deposition, or other applicable deposition processes.

In some embodiments, the plurality of bit line contacts 531 may have a square-shaped cross-sectional profile in a top-view perspective. In some embodiments, each of the plurality of bit line contacts 531 may include two first sides S1 and two second sides S2. The two first sides S1 may be parallel to each other and extending along the direction X. The two second sides S2 may be parallel to each other and extending along the direction Y. The two contact-isolating spacers 533 may cover the two first sides S1, respectively and correspondingly. In some embodiments, the width W3 (distance between the two second sides S2) of the bit line contact 531 and the width W1 of the contact-isolating spacers 533 may be substantially the same. In some embodiments, the width W3 of the bit line contact 531 may be greater than the width W1 of the contact-isolating spacers 533. In some embodiments, the ratio of the W1 of the contact-isolating spacer 533 to the width W3 of the bit line contact 531 may be between about 0.90 and 1.00 or between about 0.95 and 1.00.

Figure 21:
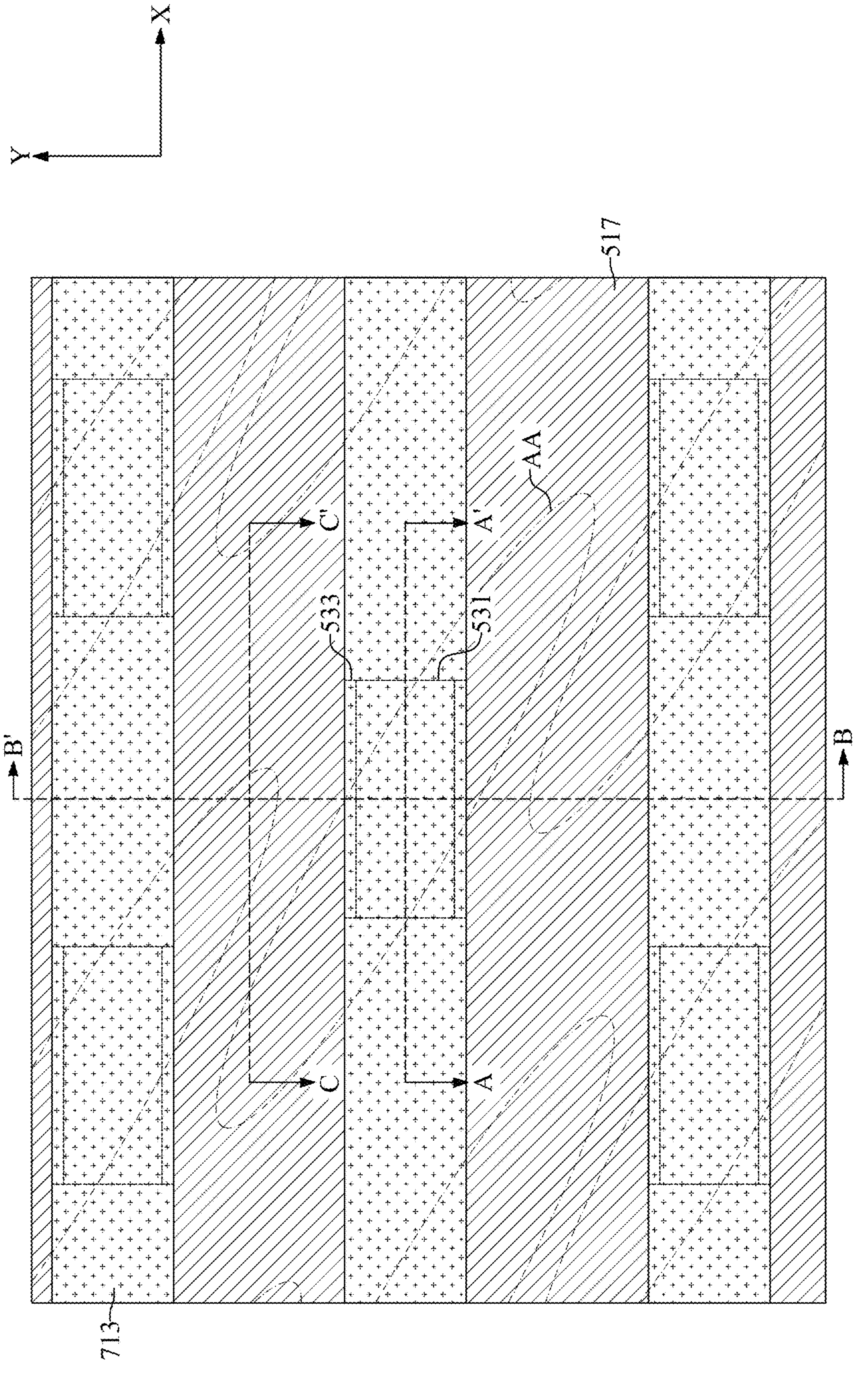
FIG. 21 illustrates, in a schematic top-view diagram, an intermediate semiconductor device in accordance with one embodiment of the present disclosure.
Figure 22:
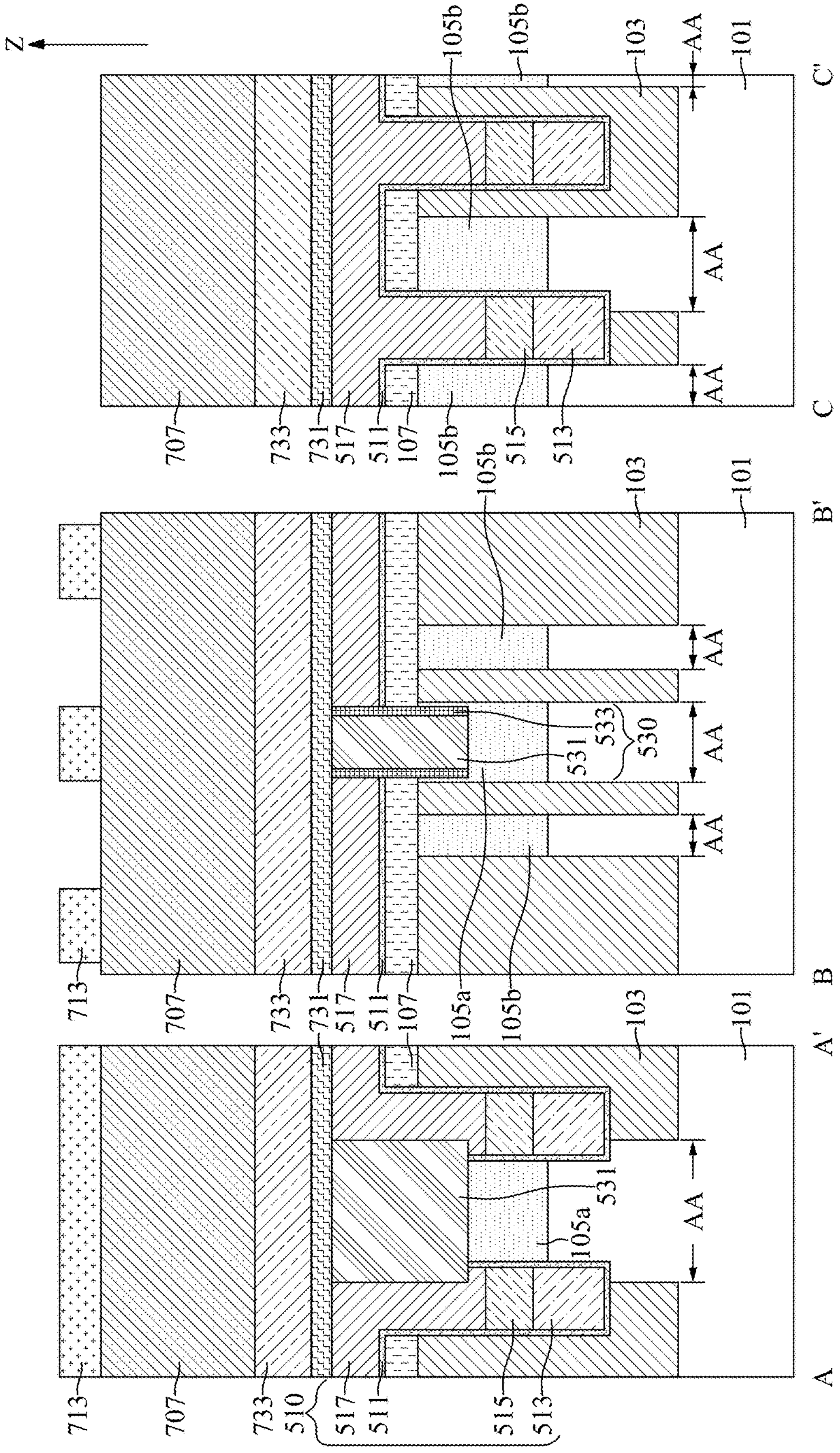
FIGS. 22 and 23 are schematic cross-sectional view diagrams taken along lines A-A', B-B', and C-C' in FIG. 21 illustrating part of the flow for fabricating the semiconductor device in accordance with one embodiment of the present disclosure.
Figure 23:
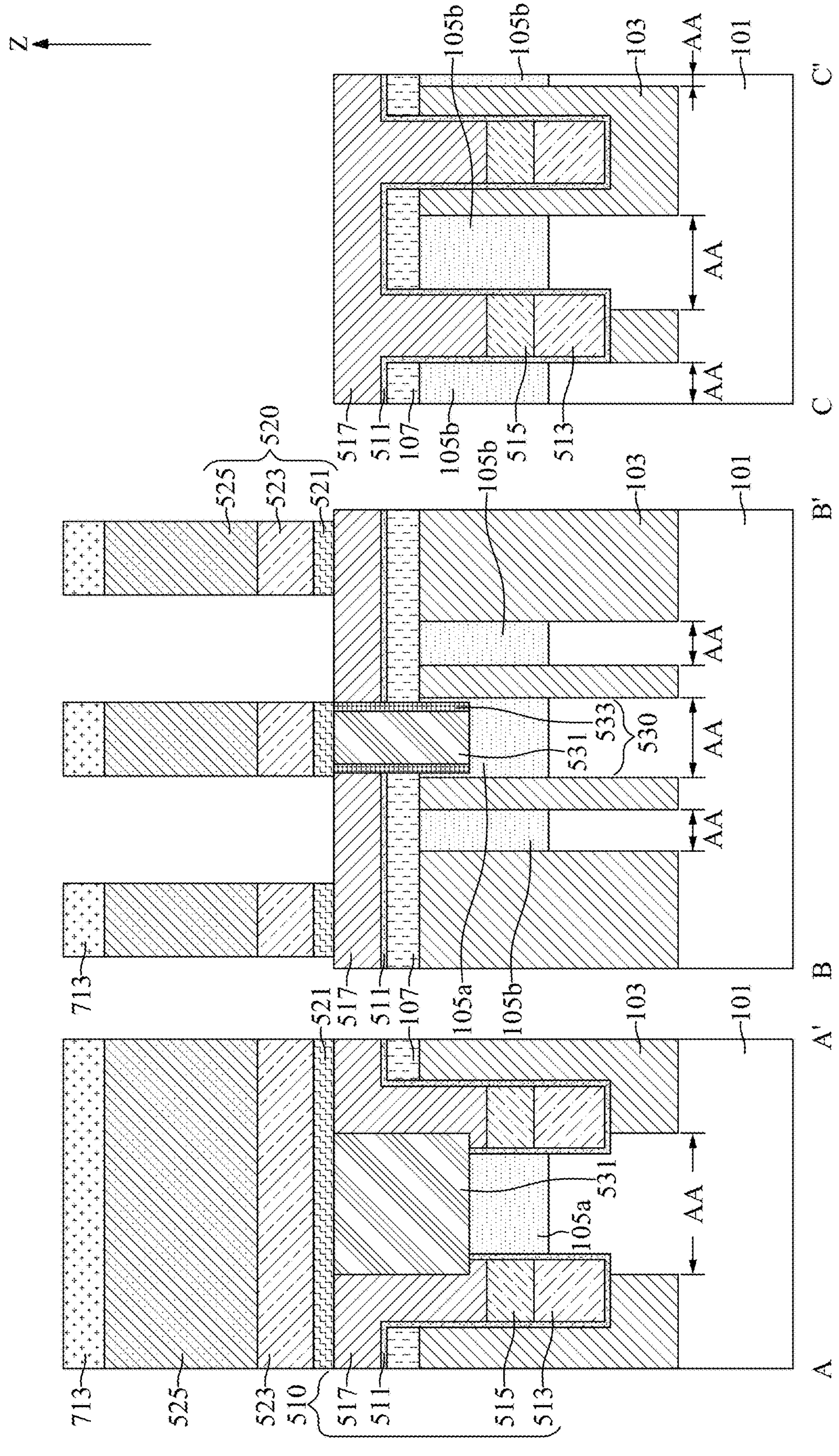

FIG. 21 illustrates, in a schematic top-view diagram, an intermediate semiconductor device in accordance with one embodiment of the present disclosure. FIGS. 22 and 23 are schematic cross-sectional view diagrams taken along lines A-A', B-B', and C-C' in FIG. 21 illustrating part of the flow for fabricating the semiconductor device 1A in accordance with one embodiment of the present disclosure.

With reference to FIG. 1 and FIGS. 21 to 23, at step S19, a plurality of bit line structures 520 may be formed on the plurality of bit line contact structures 530.

With reference to FIGS. 21 and 22, a layer of first conductive material 731 may be formed on the word line capping layer 517 and the plurality of bit line contact structures 530. In some embodiments, the first conductive material 731 may include, for example, doped polycrystalline silicon, doped polycrystalline germanium, doped polycrystalline silicon germanium, or a combination thereof. In some embodiments, the dopants for the layer of first conductive material 731 may include boron, aluminum, gallium, indium, antimony, arsenic, or phosphorus. In some embodiments, the layer of first conductive material 731 may be formed by, for example, chemical vapor deposition or other applicable deposition processes.

With reference to FIGS. 21 and 22, a layer of second conductive material 733 may be formed on the layer of first conductive material 731. In some embodiments, the second conductive material 733 may include, for example, titanium, nickel, platinum, tantalum, cobalt, silver, copper, aluminum, other applicable conductive material, or a combination thereof. In some embodiments, the layer of second conductive material 733 may be formed by, for example, physical vapor deposition, chemical vapor deposition, or other applicable deposition processes.

With reference to FIGS. 21 and 22, a layer of second insulating material 707 may be formed on the layer of second conductive material 733. In some embodiments, the second insulating material 707 may include, for example, silicon nitride or other applicable insulating material. In some embodiments, the layer of second insulating material 707 may be formed by, for example, chemical vapor deposition or other applicable deposition processes.

With reference to FIGS. 21 and 22, a second mask layer 713 may be formed on the layer of second insulating material 707. In some embodiments, the second mask layer 713 may be a photoresist layer and may include the pattern of the plurality of bit line structures 520. In some embodiments, in a top-view perspective, the pattern of the second mask layer 713 may include multiple line-shaped cross-sectional profiles extending along the direction X and alternatively arranged along the direction Y.

With reference to FIG. 23, an etching process may be performed using the second mask layer 713 as the mask to remove portions of the second insulating material 707, the second conductive material 733, and the first conductive material 731. In some embodiments, the etching process may be an anisotropic etching process such as an anisotropic dry etching process. After the etching process, the remaining first conductive material 731 may be referred to as a plurality of bit line bottom conductive layers 521. The remaining second conductive material 733 may be referred to as a plurality of bit line top conductive layers 523. The remaining second insulating material 707 may be referred to as a plurality of bit line capping layers 525. The plurality of bit line bottom conductive layers 521, the plurality of bit line top conductive layers 523, and the plurality of bit line capping layers 525 together configure the plurality of bit line structures 520.

Figure 24:
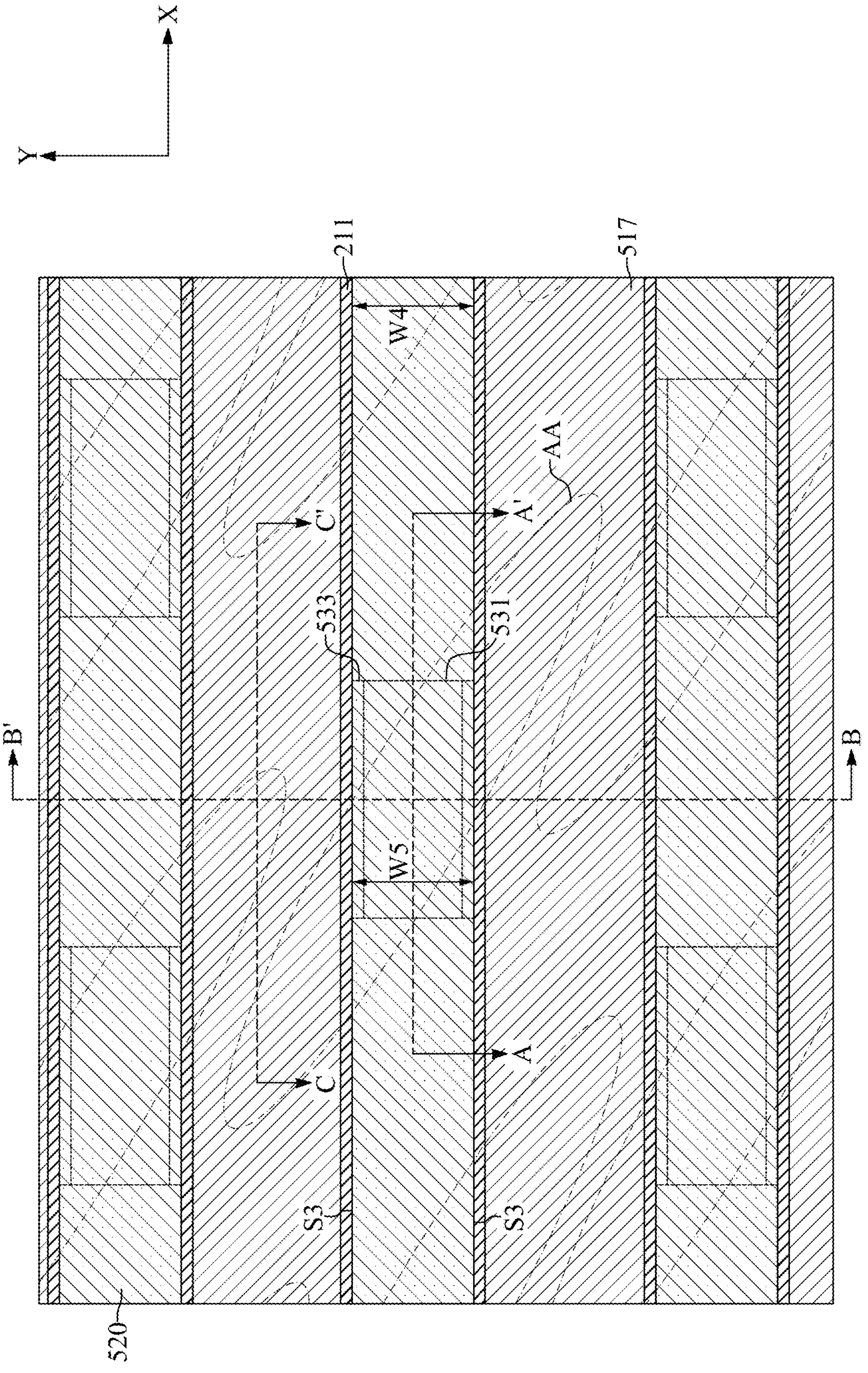
FIG. 24 illustrates, in a schematic top-view diagram, an intermediate semiconductor device in accordance with one embodiment of the present disclosure.
Figure 25:
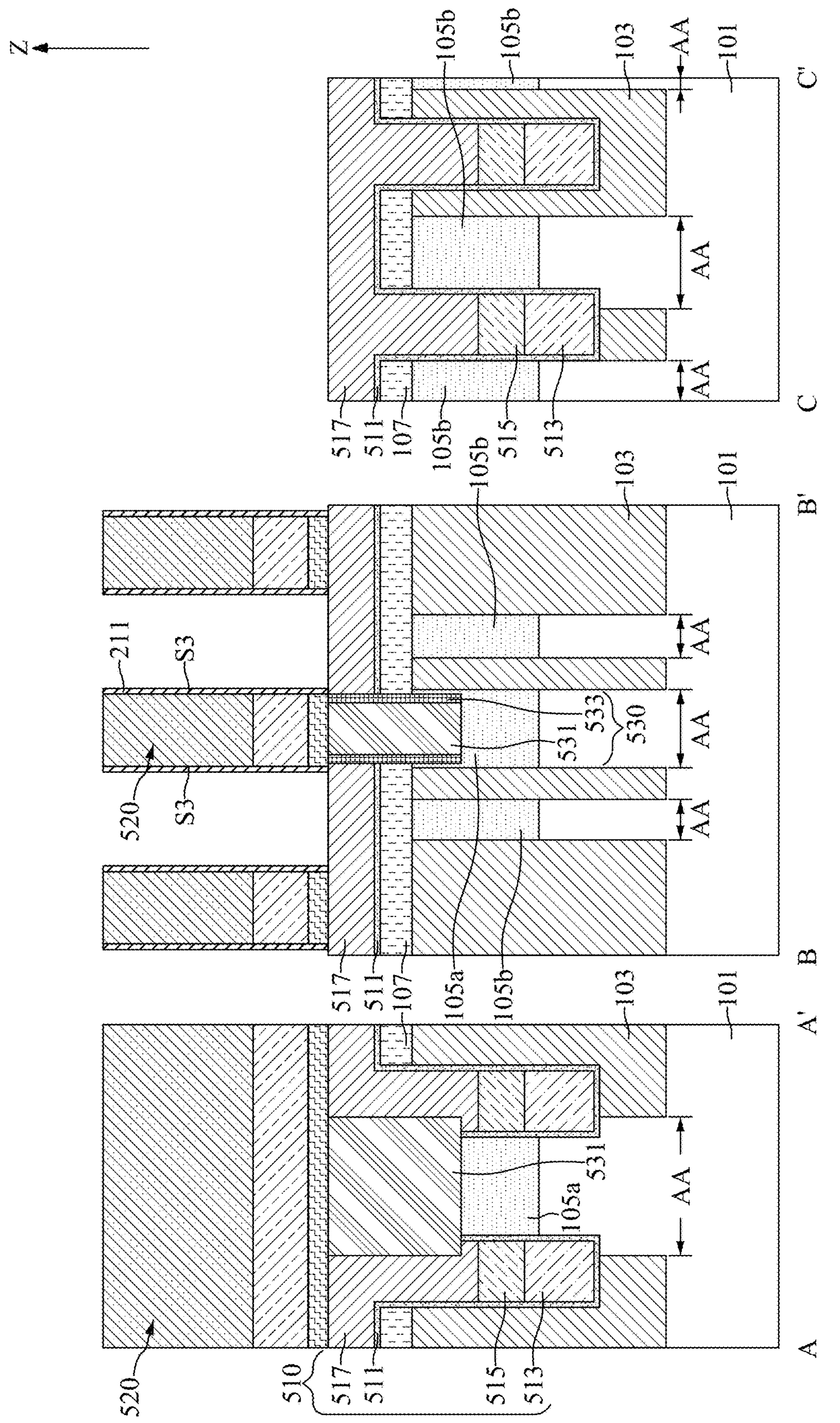
FIG. 25 is a schematic cross-sectional view diagram taken along lines A-A', B-B', and C-C' in FIG. 24.
Figure 26:
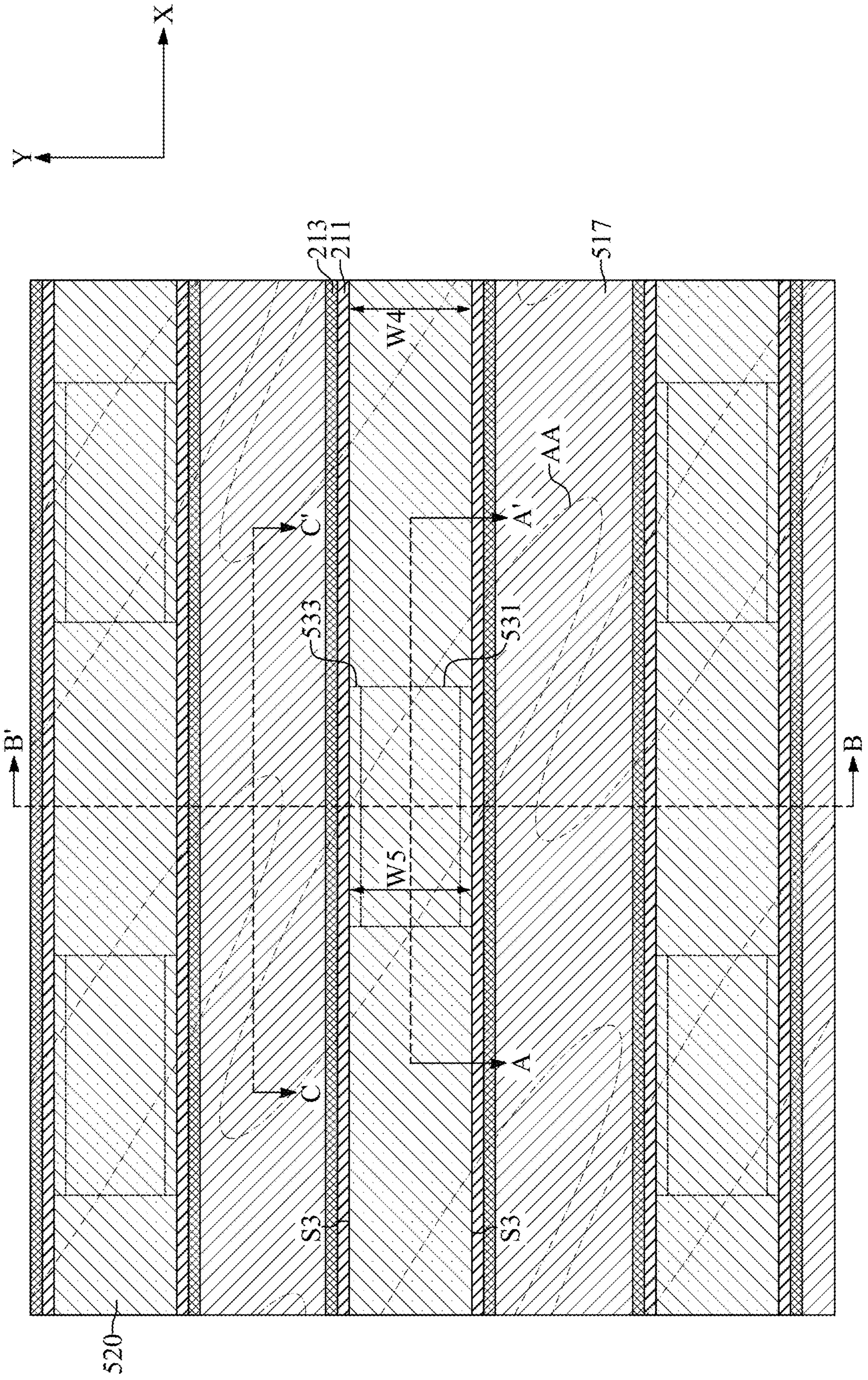
FIG. 26 illustrates, in a schematic top-view diagram, an intermediate semiconductor device in accordance with one embodiment of the present disclosure.
Figure 27:
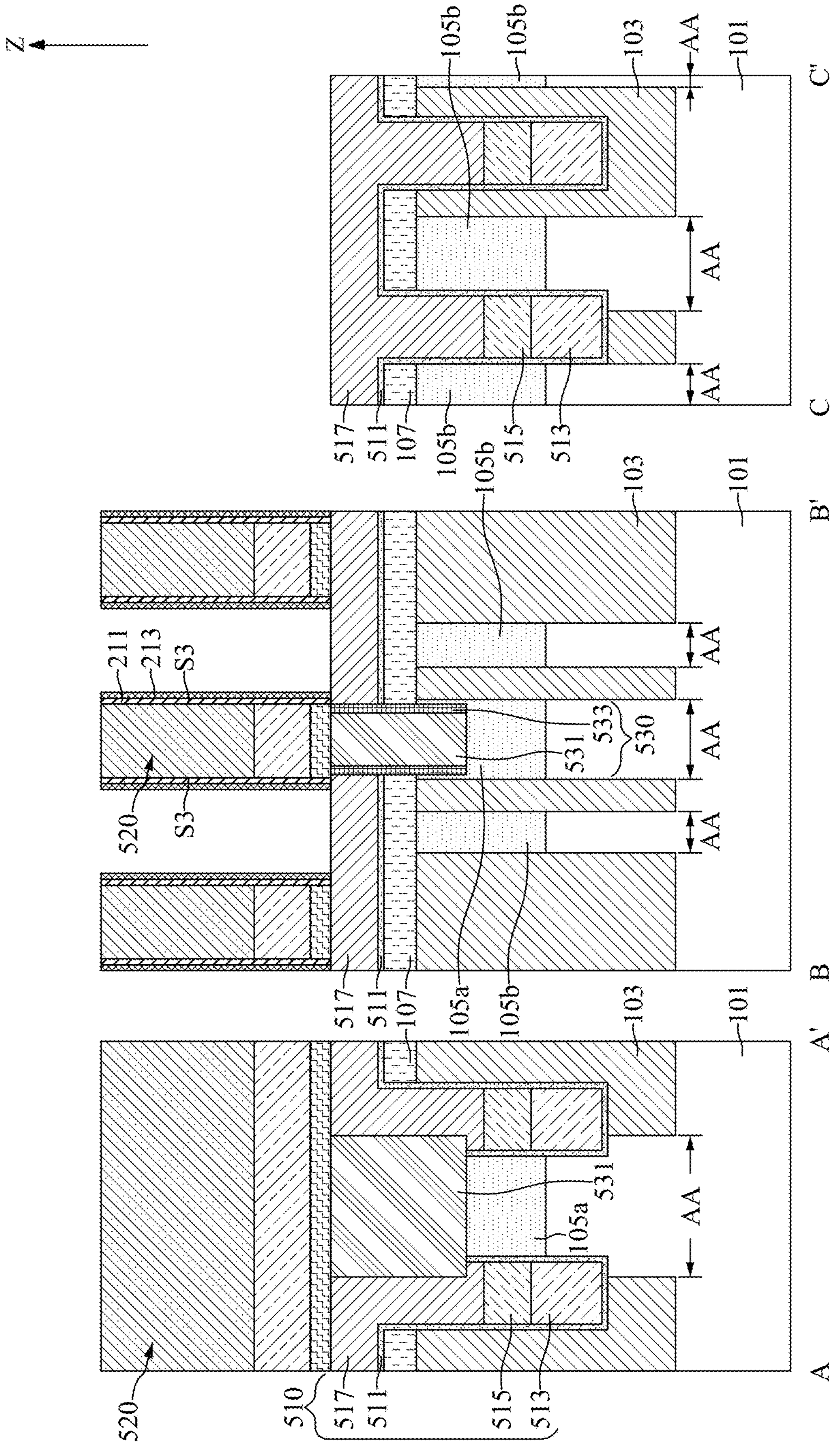
FIG. 27 is a schematic cross-sectional view diagram taken along lines A-A', B-B', and C-C' in FIG. 26.
Figure 28:
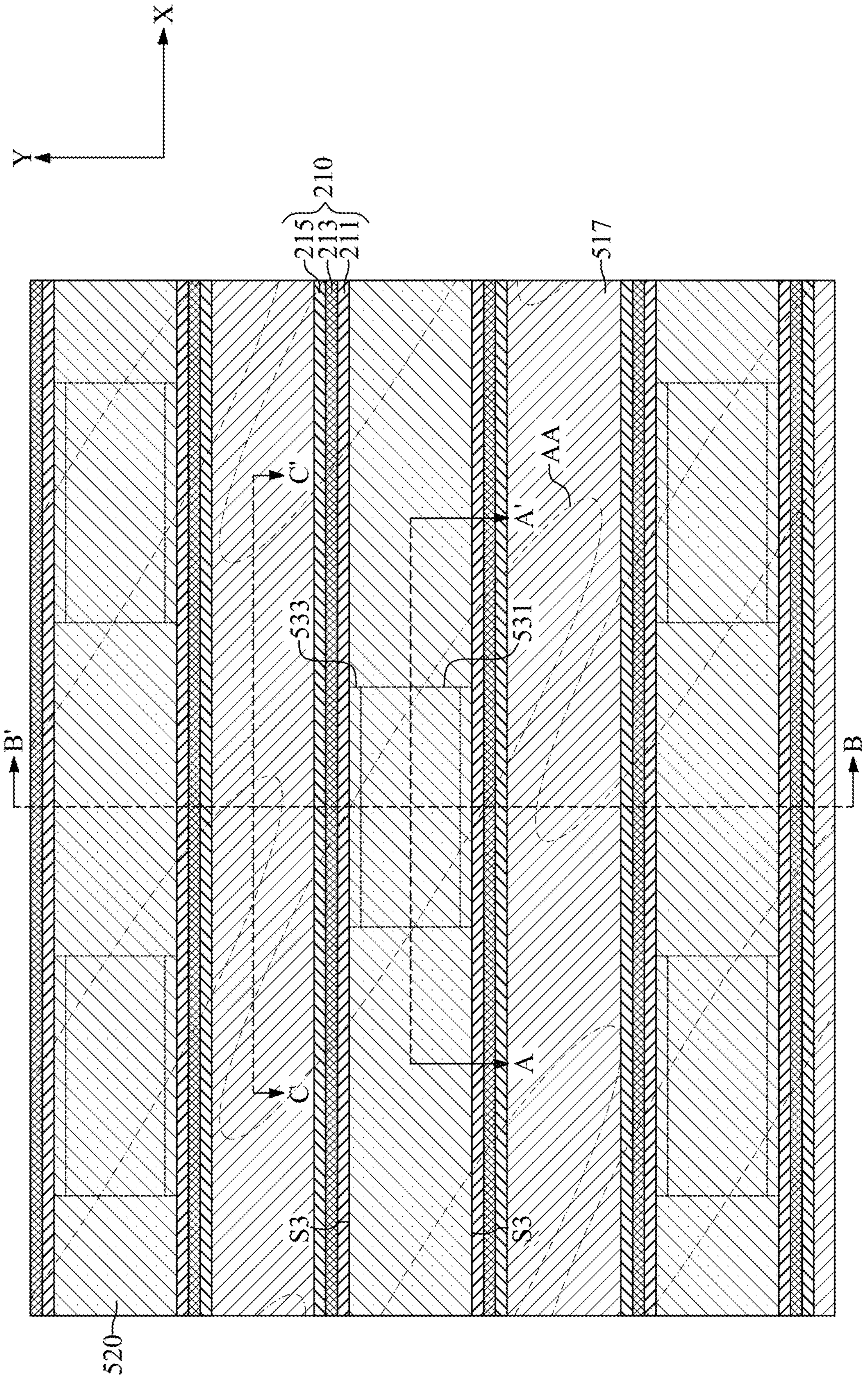
FIG. 28 illustrates, in a schematic top-view diagram, an intermediate semiconductor device in accordance with one embodiment of the present disclosure.
Figure 29:
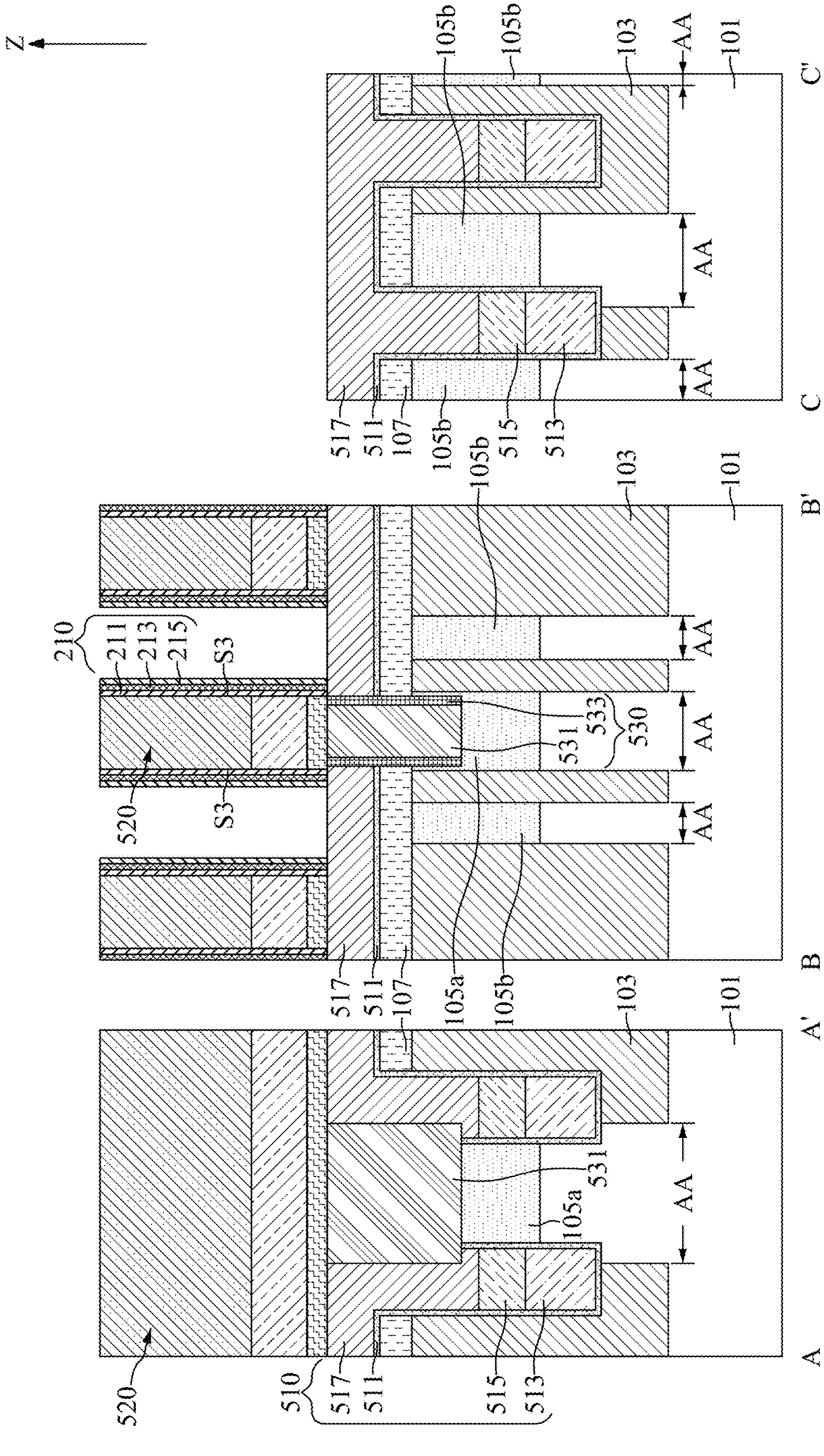
FIGS. 29 and 30 are schematic cross-sectional view diagrams taken along lines A-A', B-B', and C-C' in FIG. 28 illustrating part of the flow for fabricating the semiconductor device in accordance with one embodiment of the present disclosure.
Figure 30:
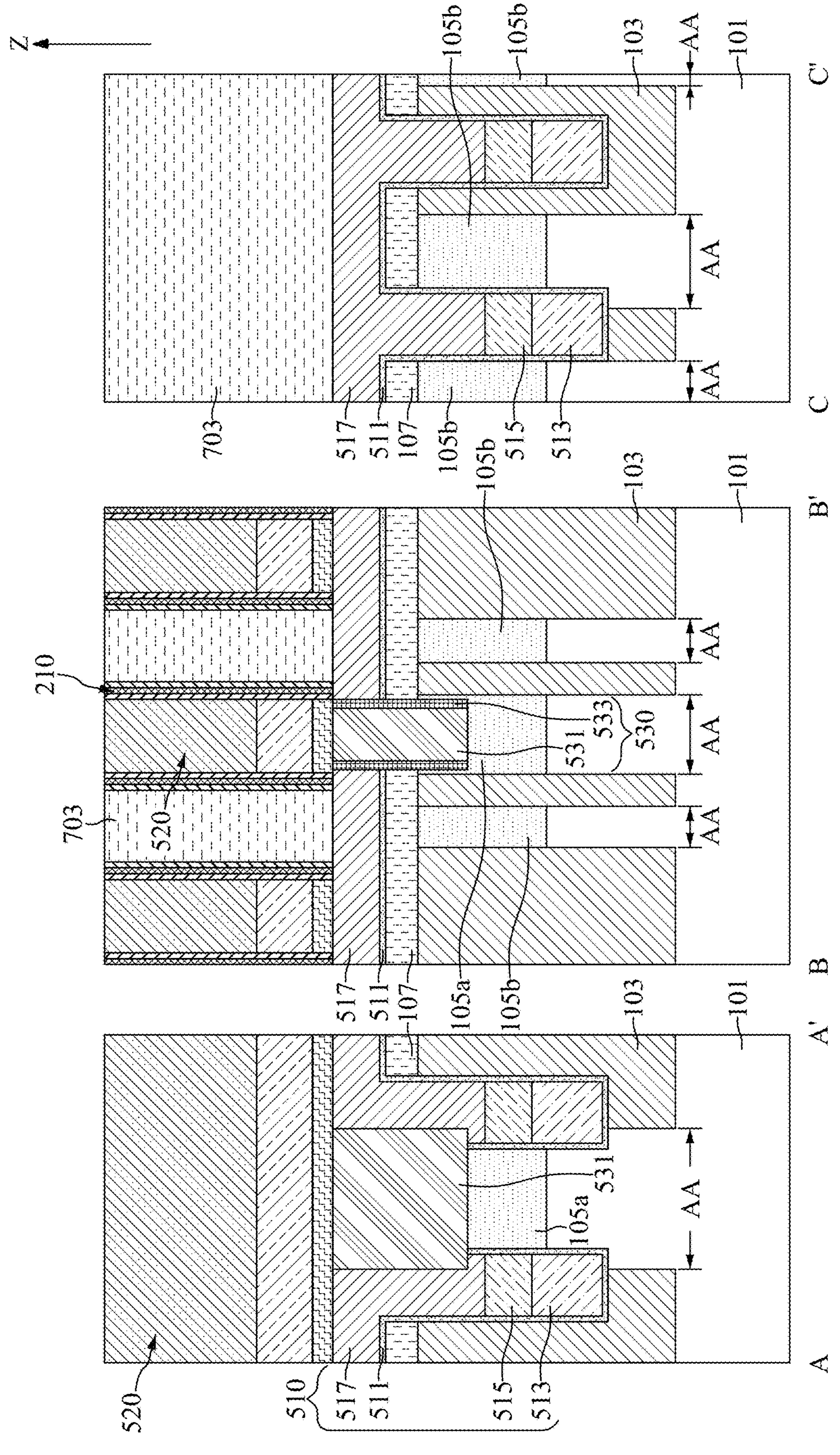

FIG. 24 illustrates, in a schematic top-view diagram, an intermediate semiconductor device in accordance with one embodiment of the present disclosure. FIG. 25 is a schematic cross-sectional view diagram taken along lines A-A', B-B', and C-C' in FIG. 24. FIG. 26 illustrates, in a schematic top-view diagram, an intermediate semiconductor device in accordance with one embodiment of the present disclosure. FIG. 27 is a schematic cross-sectional view diagram taken along lines A-A', B-B', and C-C' in FIG. 26. FIG. 28 illustrates, in a schematic top-view diagram, an intermediate semiconductor device in accordance with one embodiment of the present disclosure. FIGS. 29 and 30 are schematic cross-sectional view diagrams taken along lines A-A', B-B', and C-C' in FIG. 28 illustrating part of the flow for fabricating the semiconductor device 1A in accordance with one embodiment of the present disclosure.

With reference to FIG. 1 and FIGS. 24 to 29, at step S21, a plurality of spacer structures 210 may be formed on sides S3 of the plurality of bit line structures 520.

With reference to FIGS. 24 and 25, the second mask layer 713 may be removed. In some embodiments, in a top-view perspective, each of the plurality of bit line structures 520 may include a line-shaped (or rectangle-shaped) cross-sectional profile extending along the direction X. The plurality of bit line structures 520 may be alternatively arranged along the direction Y. In some embodiments, the width W4 of the bit line structure 520 and the width W5 of the bit line contact structure 530 may be substantially the same. In some embodiments, the width W5 of the bit line contact structure 530 may be less than the width W4 of the bit line structure 520.

With reference to FIGS. 24 and 25, a plurality of inner spacers 211 may be formed on the top surface of the word line capping layer 517 and covering the sides S3 of the plurality of bit line structures 520, respectively and correspondingly. In some embodiments, the plurality of inner spacers 211 may be formed of the same material as the bit line capping layer 525. In some embodiments, the plurality of inner spacers 211 may be formed of, for example, silicon nitride or other applicable insulating material. In some embodiments, the plurality of inner spacers 211 may be formed by conformally depositing a layer of insulating material (not shown) over the bottom insulating layer 107 and a subsequent anisotropic etching process.

With reference to FIGS. 24 and 25, a plurality of middle spacers 213 may be formed on the word line capping layer 517 and conformally covering the plurality of inner spacers 211, respectively and correspondingly. In some embodiments, the plurality of middle spacers 213 may be formed of, for example, silicon oxide or other applicable insulating oxides. In some embodiments, the plurality of middle spacers 213 may be formed by conformally depositing a layer of insulating oxide (not shown) over the bottom insulating layer 107 and a subsequent anisotropic etching process.

With reference to FIGS. 24 and 25, a plurality of outer spacers 215 may be formed on the word line capping layer 517 and conformally covering the plurality of middle spacers 213, respectively and correspondingly. In some embodiments, the first outer spacer 215 may be formed of the same material as the plurality of inner spacers 211 or the bit line capping layer 525. In some embodiments, the plurality of outer spacers 215 may be formed of, for example, silicon nitride or other applicable insulating material. In some embodiments, the plurality of outer spacers 215 may be formed by conformally depositing a layer of insulating material (not shown) over the bottom insulating layer 107 and a subsequent anisotropic etching process.

The plurality of inner spacers 211, the plurality of middle spacers 213, and the plurality of outer spacers 215 together configure the plurality of spacer structures 210.

In some embodiments, the plurality of inner spacers 211 may be optional. That is, the plurality of middle spacers 213 may be directly formed on the sides S3 of the plurality of bit line structures 520.

Figure 31:
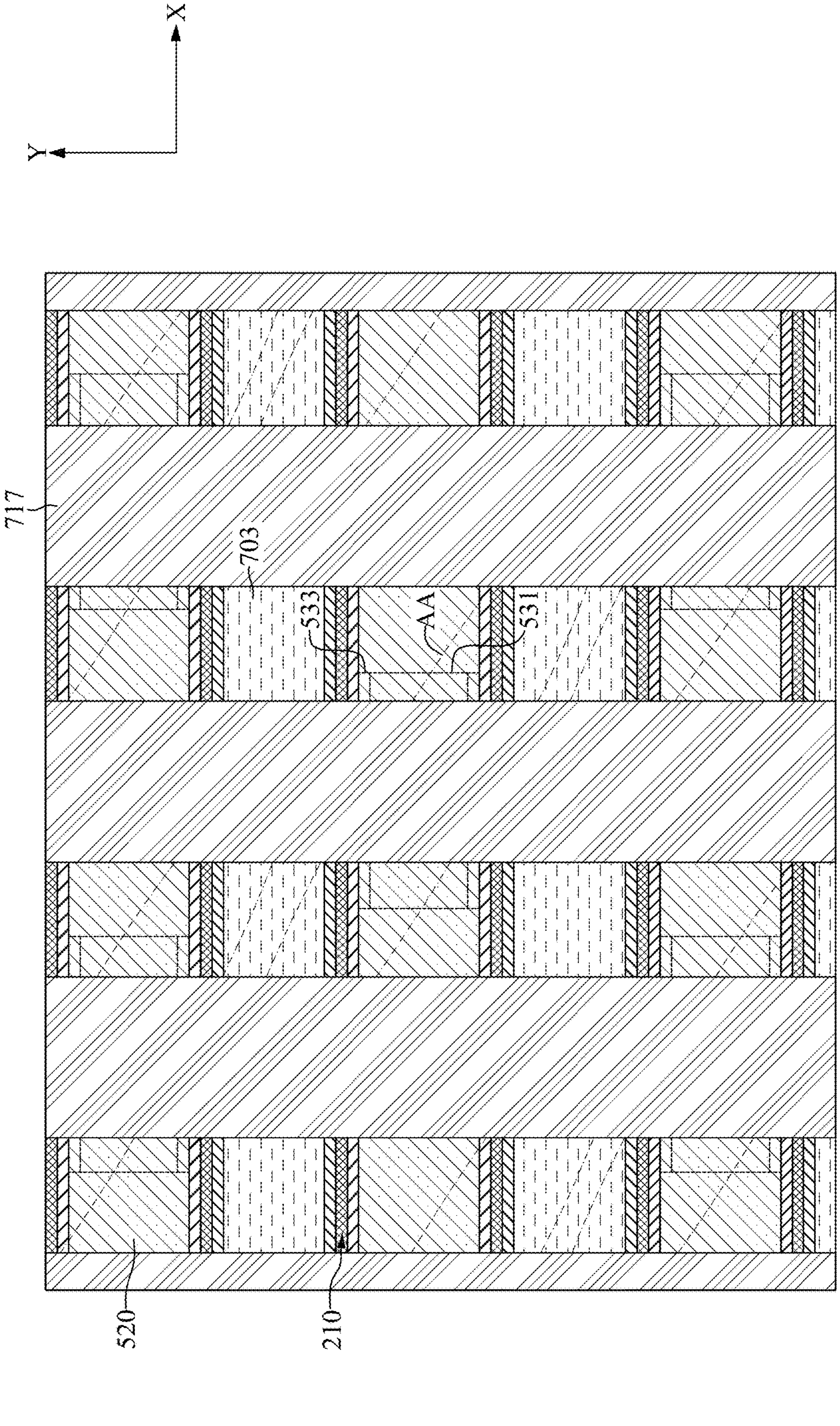
FIG. 31 illustrates, in a schematic top-view diagram, an intermediate semiconductor device in accordance with one embodiment of the present disclosure.
Figure 32:
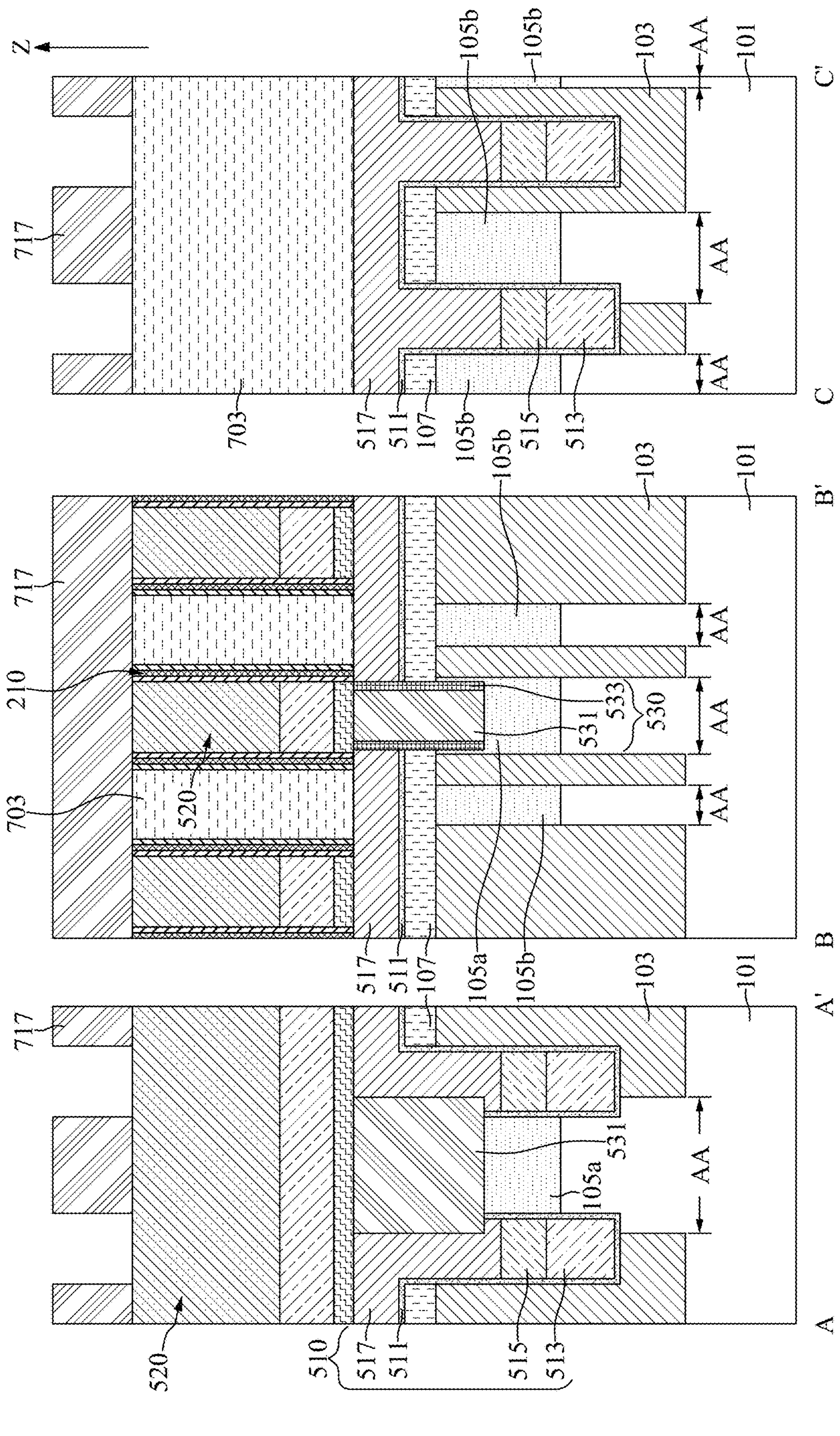
FIG. 32 is a schematic cross-sectional view diagram taken along lines A-A', B-B', and C-C' in FIG. 31.
Figure 33:
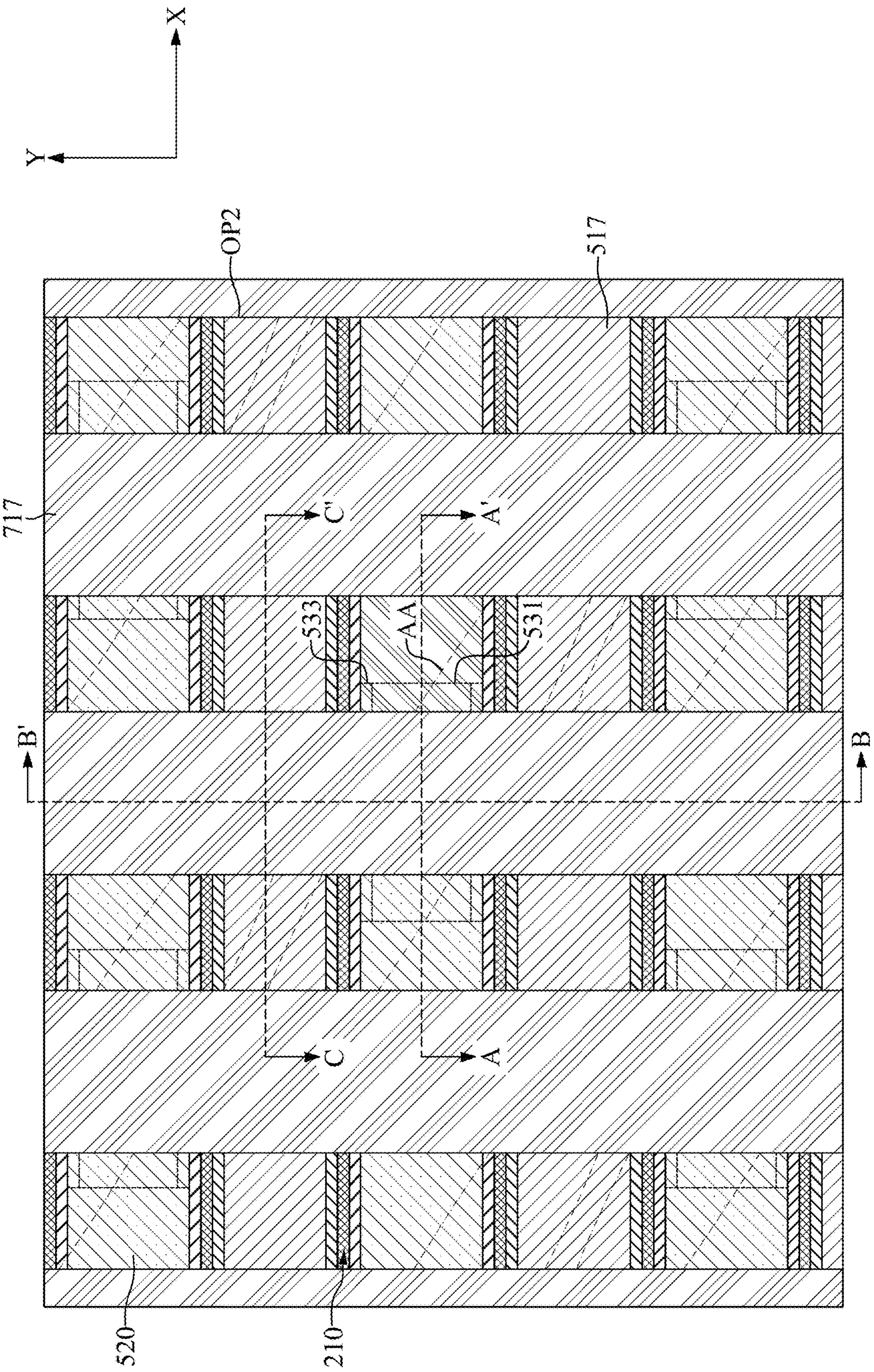
FIG. 33 illustrates, in a schematic top-view diagram, an intermediate semiconductor device in accordance with one embodiment of the present disclosure.
Figure 34:
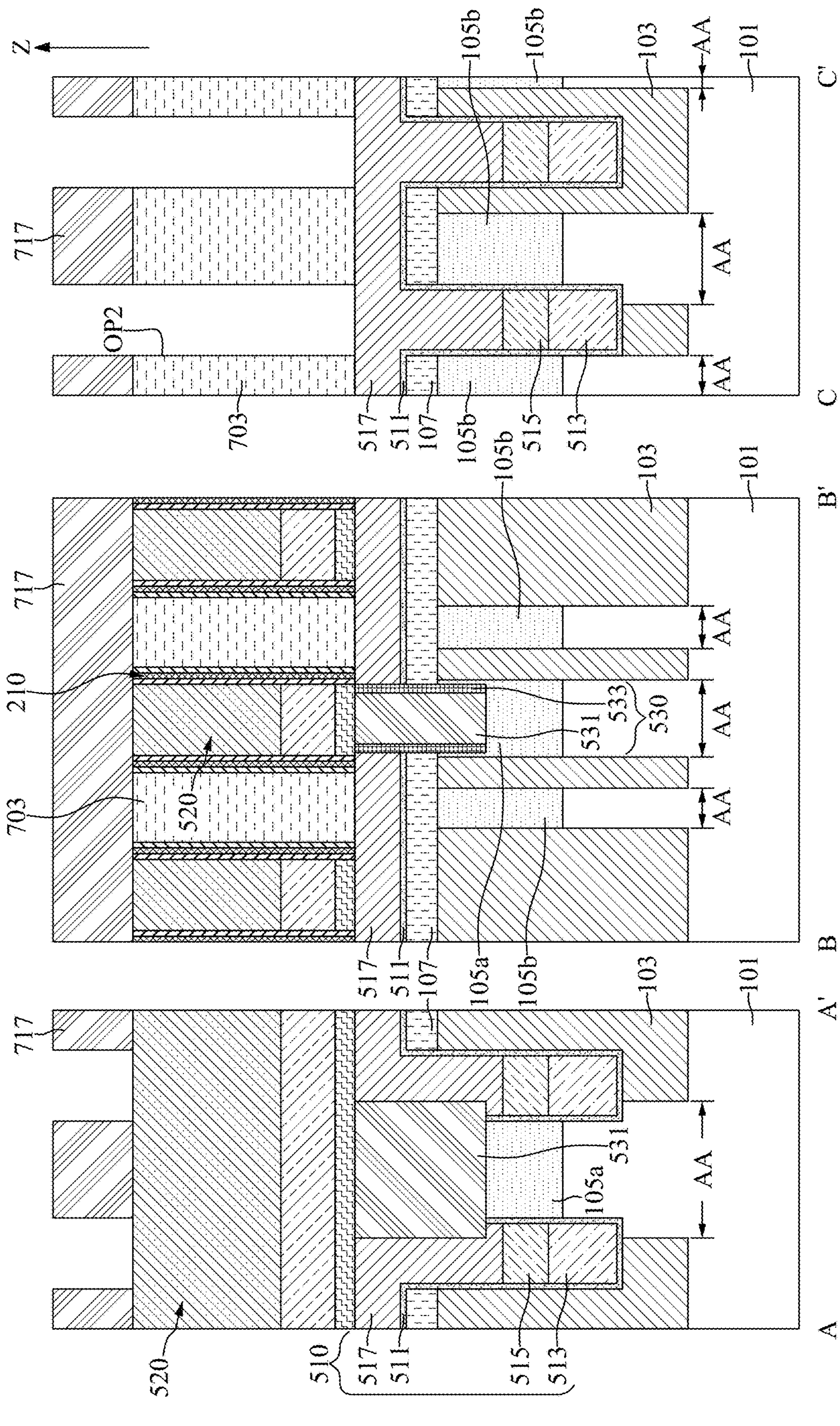
FIG. 34 is a schematic cross-sectional view diagram taken along lines A-A', B-B', and C-C' in FIG. 33.
Figure 35:
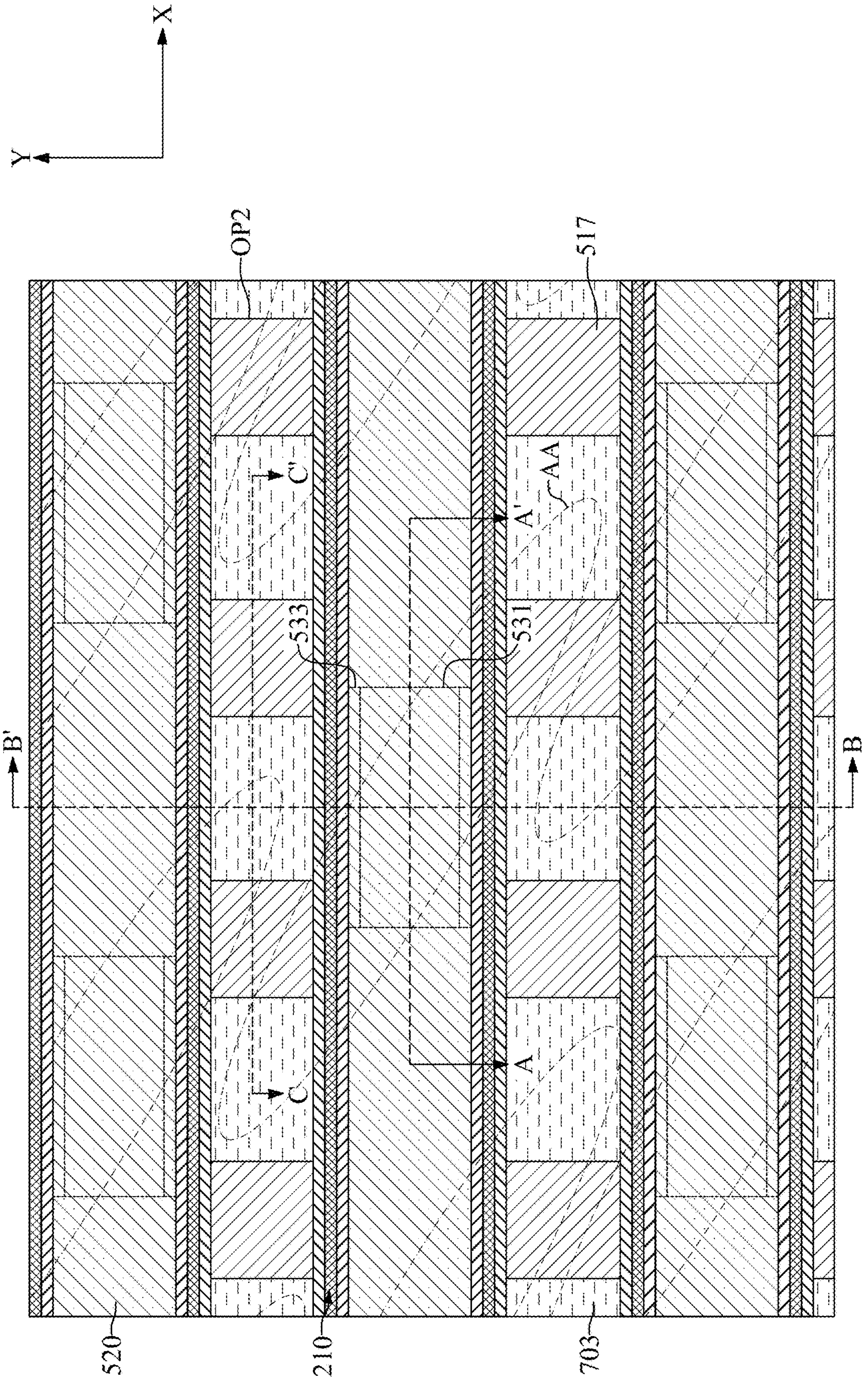
FIG. 35 illustrates, in a schematic top-view diagram, an intermediate semiconductor device in accordance with one embodiment of the present disclosure.
Figure 36:
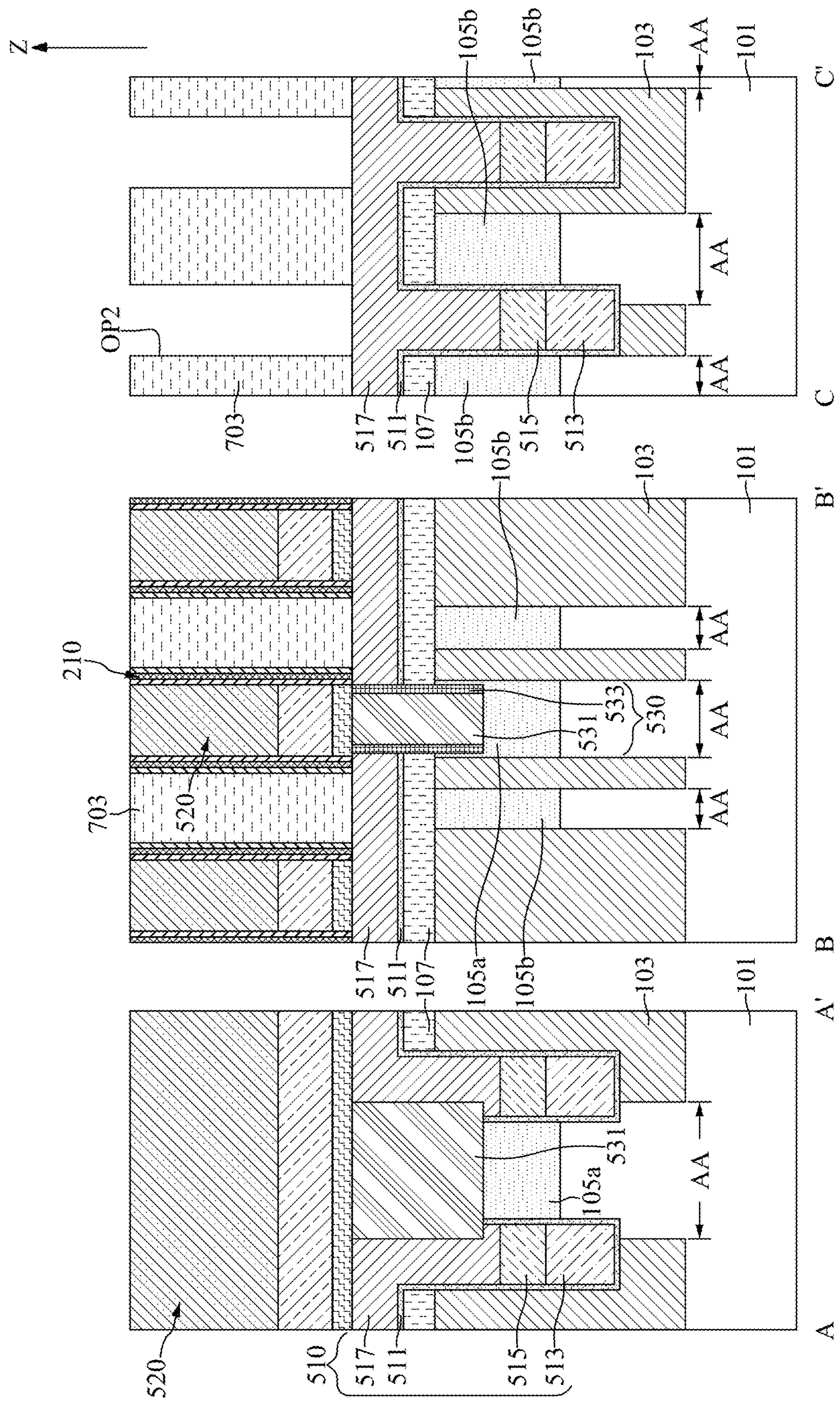
FIG. 36 is a schematic cross-sectional view diagram taken along lines A-A', B-B', and C-C' in FIG. 35.
Figure 37:
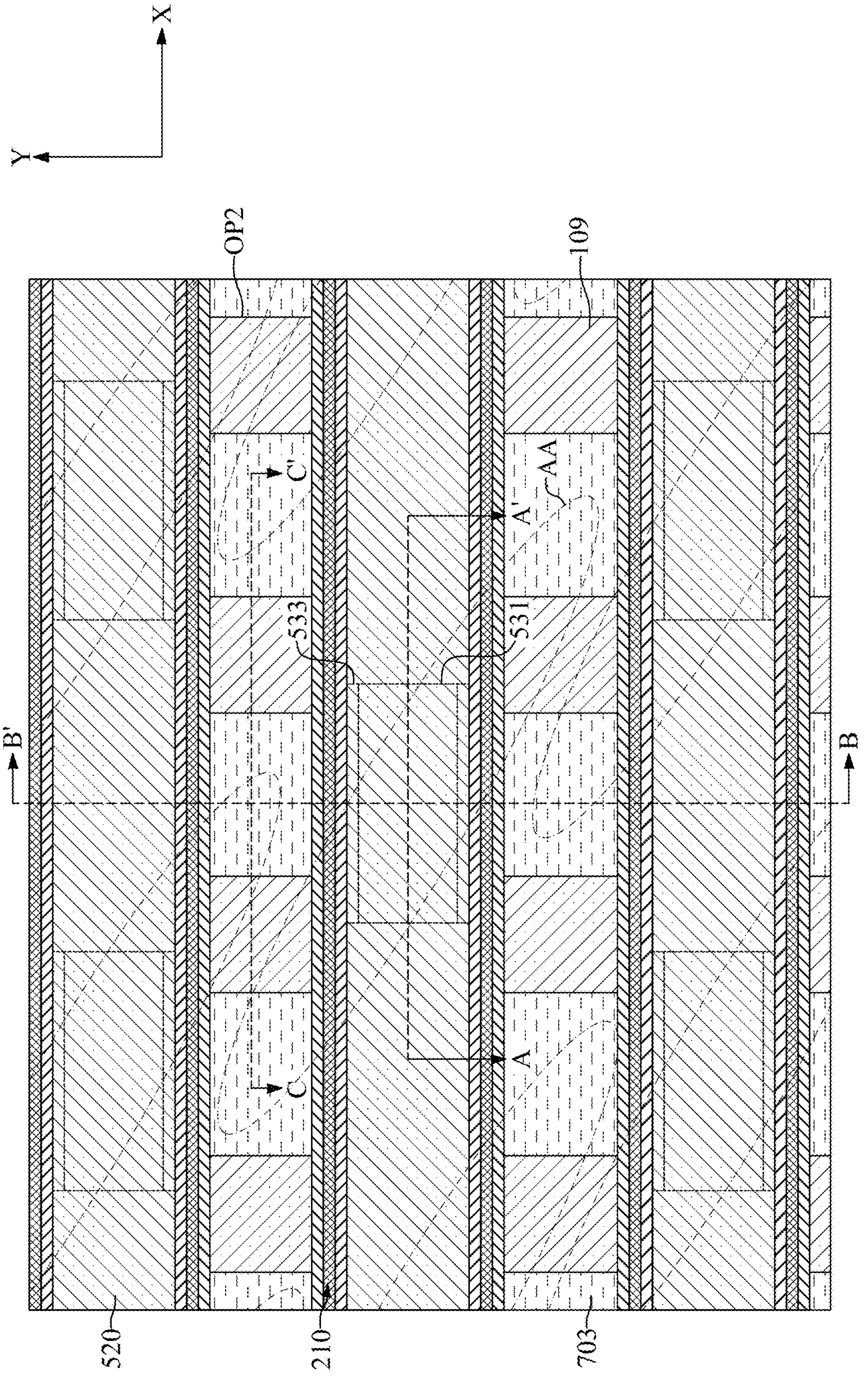
FIG. 37 illustrates, in a schematic top-view diagram, an intermediate semiconductor device in accordance with one embodiment of the present disclosure.
Figure 38:
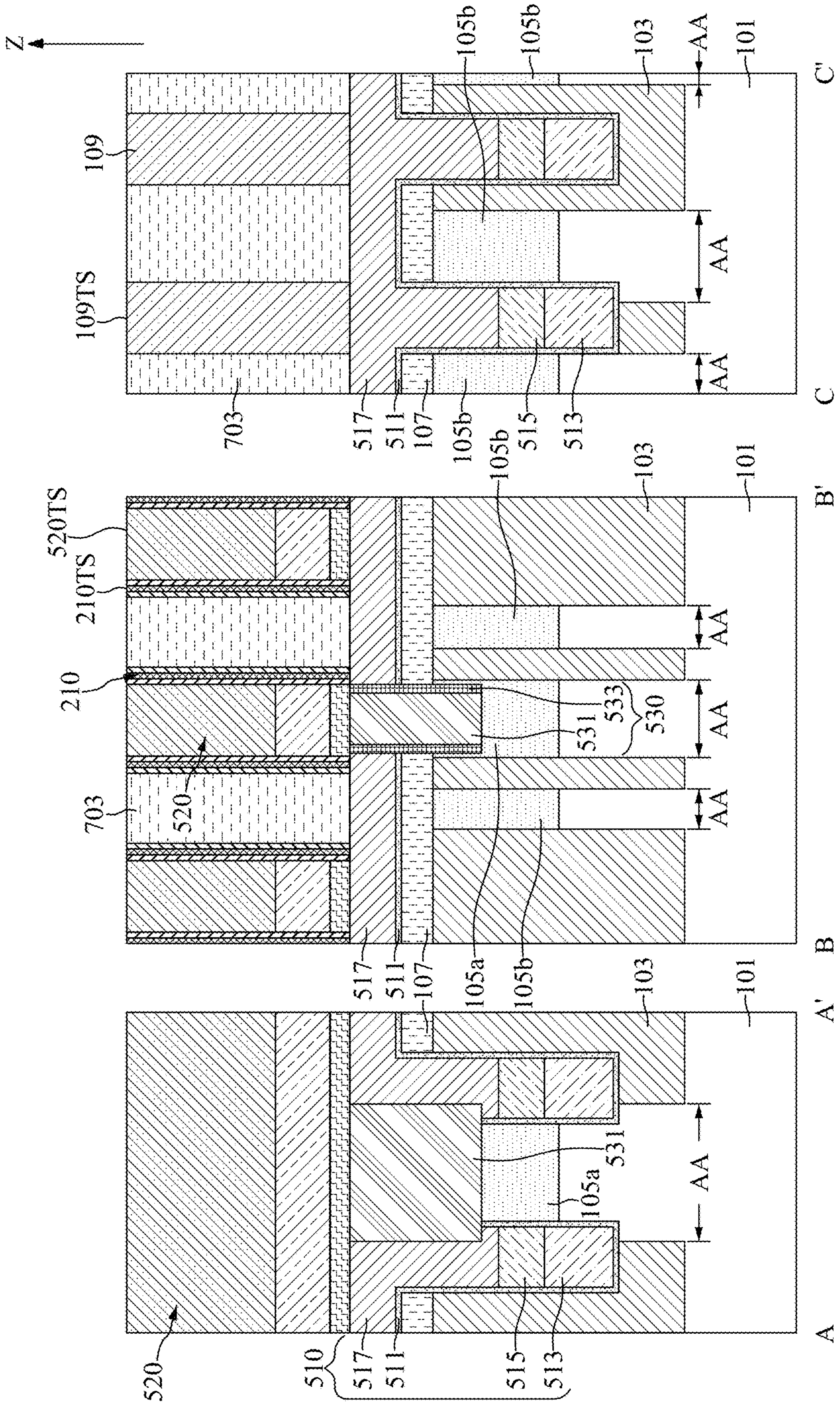
FIG. 38 is a schematic cross-sectional view diagram taken along lines A-A', B-B', and C-C' in FIG. 37.
Figure 39:
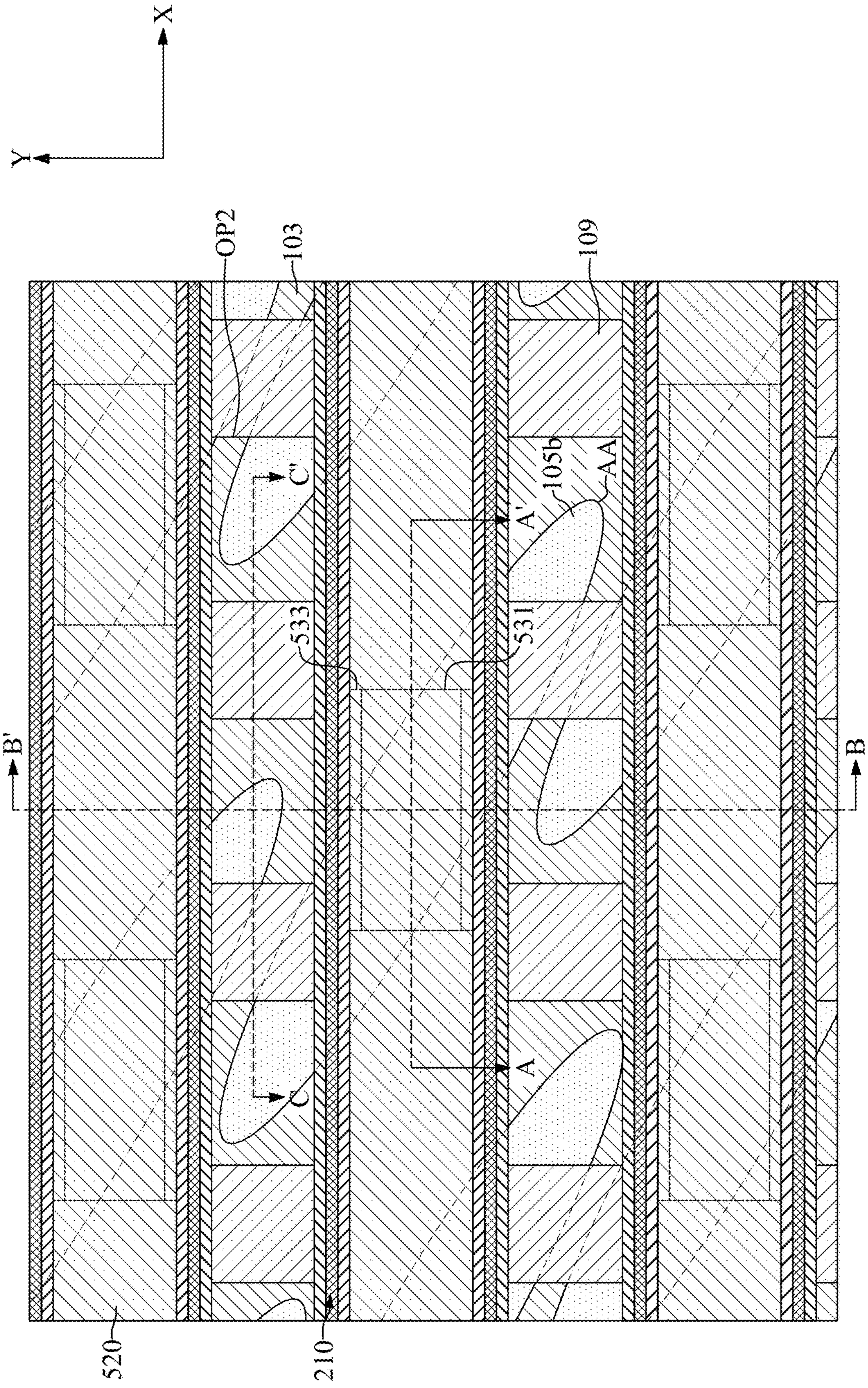
FIG. 39 illustrates, in a schematic top-view diagram, an intermediate semiconductor device in accordance with one embodiment of the present disclosure.
Figure 40:
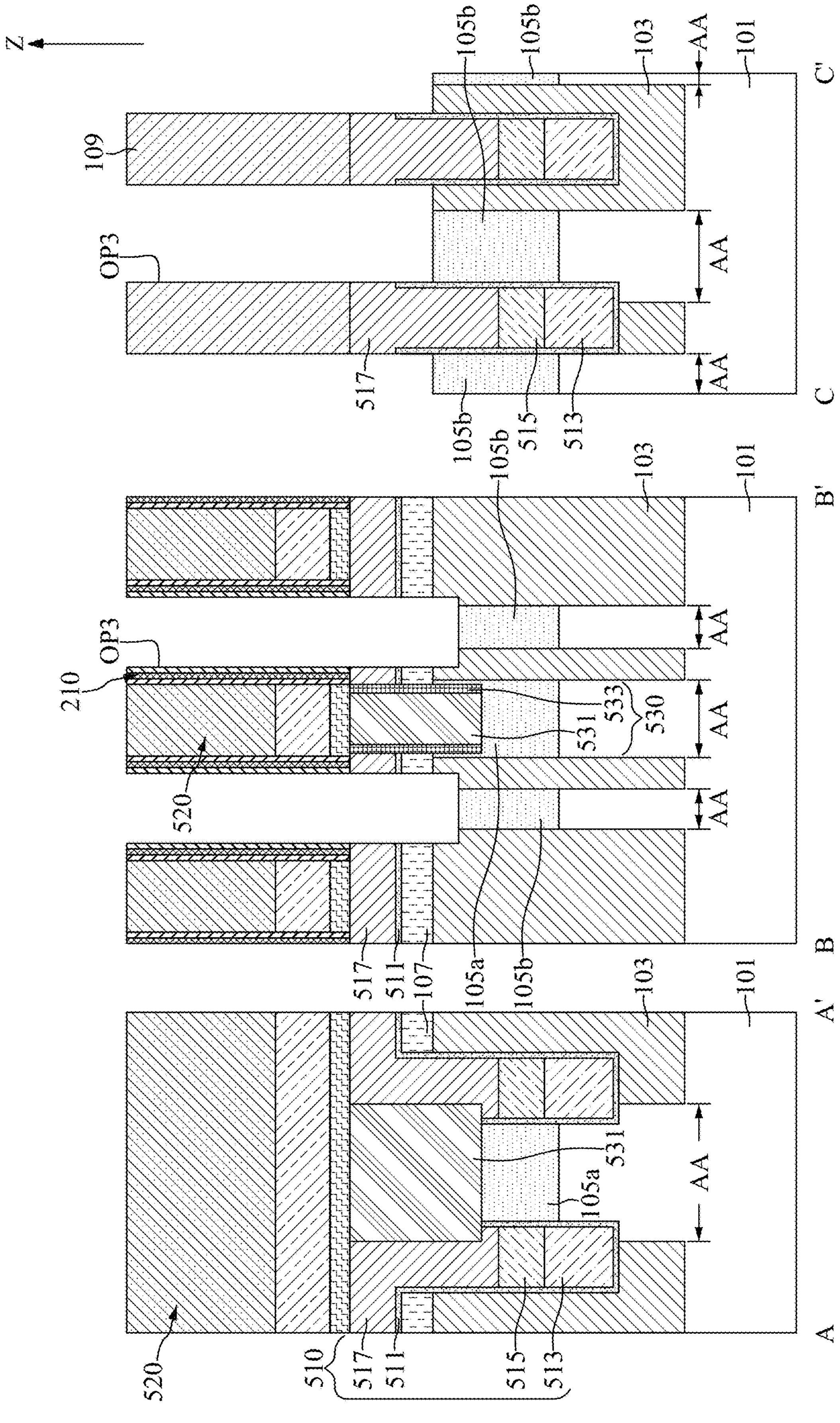
FIG. 40 is a schematic cross-sectional view diagram taken along lines A-A', B-B', and C-C' in FIG. 39.

FIG. 31 illustrates, in a schematic top-view diagram, an intermediate semiconductor device in accordance with one embodiment of the present disclosure. FIG. 32 is a schematic cross-sectional view diagram taken along lines A-A', B-B', and C-C' in FIG. 31. FIG. 33 illustrates, in a schematic top-view diagram, an intermediate semiconductor device in accordance with one embodiment of the present disclosure. FIG. 34 is a schematic cross-sectional view diagram taken along lines A-A', B-B', and C-C' in FIG. 33. FIG. 35 illustrates, in a schematic top-view diagram, an intermediate semiconductor device in accordance with one embodiment of the present disclosure. FIG. 36 is a schematic cross-sectional view diagram taken along lines A-A', B-B', and C-C' in FIG. 35. FIG. 37 illustrates, in a schematic top-view diagram, an intermediate semiconductor device in accordance with one embodiment of the present disclosure. FIG. 38 is a schematic cross-sectional view diagram taken along lines A-A', B-B', and C-C' in FIG. 37. FIG. 39 illustrates, in a schematic top-view diagram, an intermediate semiconductor device in accordance with one embodiment of the present disclosure. FIG. 40 is a schematic cross-sectional view diagram taken along lines A-A', B-B', and C-C' in FIG. 39.

With reference to FIG. 1 and FIGS. 30 to 40, at step S23, a plurality of partition layers 109 may be formed between the plurality of bit line structures 520 to define a plurality of cell contact openings OP3.

With reference to FIG. 30, a sacrificial layer 703 may be formed over the word line capping layer 517, the plurality of bit line structures 520, and the plurality of spacer structures 210 to completely fill the spaces between the plurality of spacer structures 210 and cover the plurality of bit line structures 520 and the plurality of spacer structures 210. In some embodiments, the sacrificial layer 703 may be formed of, for example, a material having etching selectivity to the plurality of spacer structures 210 and the plurality of bit line structures 520. In some embodiments, the sacrificial layer 703 may be formed of, for example, silicon oxynitride, silicon nitride oxide, or other applicable materials. In some embodiments, the sacrificial layer 703 may be formed by, for example, chemical vapor deposition, plasma-enhanced chemical vapor deposition, or other applicable deposition processes. In some embodiments, a planarization process, such as chemical mechanical polishing, may be performed until the top surfaces of the plurality of bit line structures 520 are exposed to remove excess material and provide a substantially flat surface for subsequent processing steps.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 31 and 32, a partition mask layer 717 may be formed over the plurality of bit line structures 520, the plurality of spacer structures 210, and the sacrificial layer 703. In some embodiments, the partition mask layer 717 may be a photoresist layer and a grating pattern. In a top-view perspective, the grating pattern of the partition mask layer 717 may include multiple rectangle-shaped spaces extending along the direction Y and arranged alternatively along the direction X. Through these spaces, the sacrificial layer 703, the bit line structure 520, and the spacer structure 210 may be partially exposed.

With reference to FIGS. 33 and 34, the sacrificial layer 703 that is exposed through the grating pattern of the partition mask layer 717 may be selectively removed. In some embodiments, the removal of the sacrificial layer 703 may be achieved by an anisotropic etching process such as an anisotropic dry etching process. After the removal of the sacrificial layer 703, a plurality of partition openings OP2 may be formed in the locations where the sacrificial layer 703 was exposed through the grating pattern of the partition mask layer 717.

With reference to FIGS. 35 and 36, the partition mask layer 717 may be removed after the formation of the plurality of partition openings OP2.

With reference to FIGS. 37 and 38, a layer of partition material (not shown) may be formed over the sacrificial layer 703 to completely fill the plurality of partition openings OP2. In some embodiments, the partition material may be a material having etching selectivity to the sacrificial layer 703. In some embodiments, the partition material may be the same material as the bit line capping layer 525 or the outer spacer 215. In some embodiments, the partition material may be, for example, silicon nitride or other applicable insulating material. In some embodiments, the layer of partition material may be formed of, for example, chemical vapor deposition or other applicable deposition processes.

Subsequently, a planarization process, such as chemical mechanical polishing, may be performed to remove excess material, provide a substantially flat surface for subsequent processing steps, and turn the layer of partition material into the plurality of partition layers 109. In a top-view perspective, each of the plurality of partition layers 109 may have a line-shaped (or rectangle-shaped or square-shaped) cross-sectional profile. The plurality of partition layers 109 may be arranged alternatively along the direction Y, with each corresponding bit line structure 520 situated between two adjacent partition layers 109. Along the direction X, the plurality of partition layers 109 may be arranged alternatively with the sacrificial layer 703 interposed therebetween. In a top-view perspective, the arrangement of the plurality of partition layers 109 and the plurality of bit line structures 520 may divide the sacrificial layer 703 into multiple segments.

In some embodiments, the top surface 109TS of the partition layer 109, the top surface 210TS of the spacer structure 210, and the top surface 520TS of the bit line structure 520 may be substantially coplanar.

With reference to FIGS. 39 and 40, the sacrificial layer 703 may be selectively removed by an etching process. For example, the removal of the sacrificial layer 703 may be achieved by an anisotropic etching process. After the removal of the sacrificial layer 703, the plurality of cell contact openings OP3 may be formed in the locations where the sacrificial layer 703 (in multiple segments form) was previously occupied. For brevity, clarity, and convenience of description, only one cell contact opening OP3 is described. In a cross-sectional perspective, after the removal process, the cell contact opening OP3 may be disposed on the bottom insulating layer 107. A punch-through etching process may be subsequently performed to remove portions of the bottom insulating layer 107 that exposes through the cell contact opening OP3. In some embodiments, the punch-through etching process may be an anisotropic dry etching process. The punch-through etching process may extend the cell contact opening OP3 downward to the substrate 101. After the punch-through etching process, the drain region 105*b* may be exposed through the cell contact opening OP3. In a top-view perspective, the cell contact opening OP3 may be enclosed by two adjacent partition layers 109 along the direction X and two adjacent spacer structures 210 along the direction Y.

Figure 41:
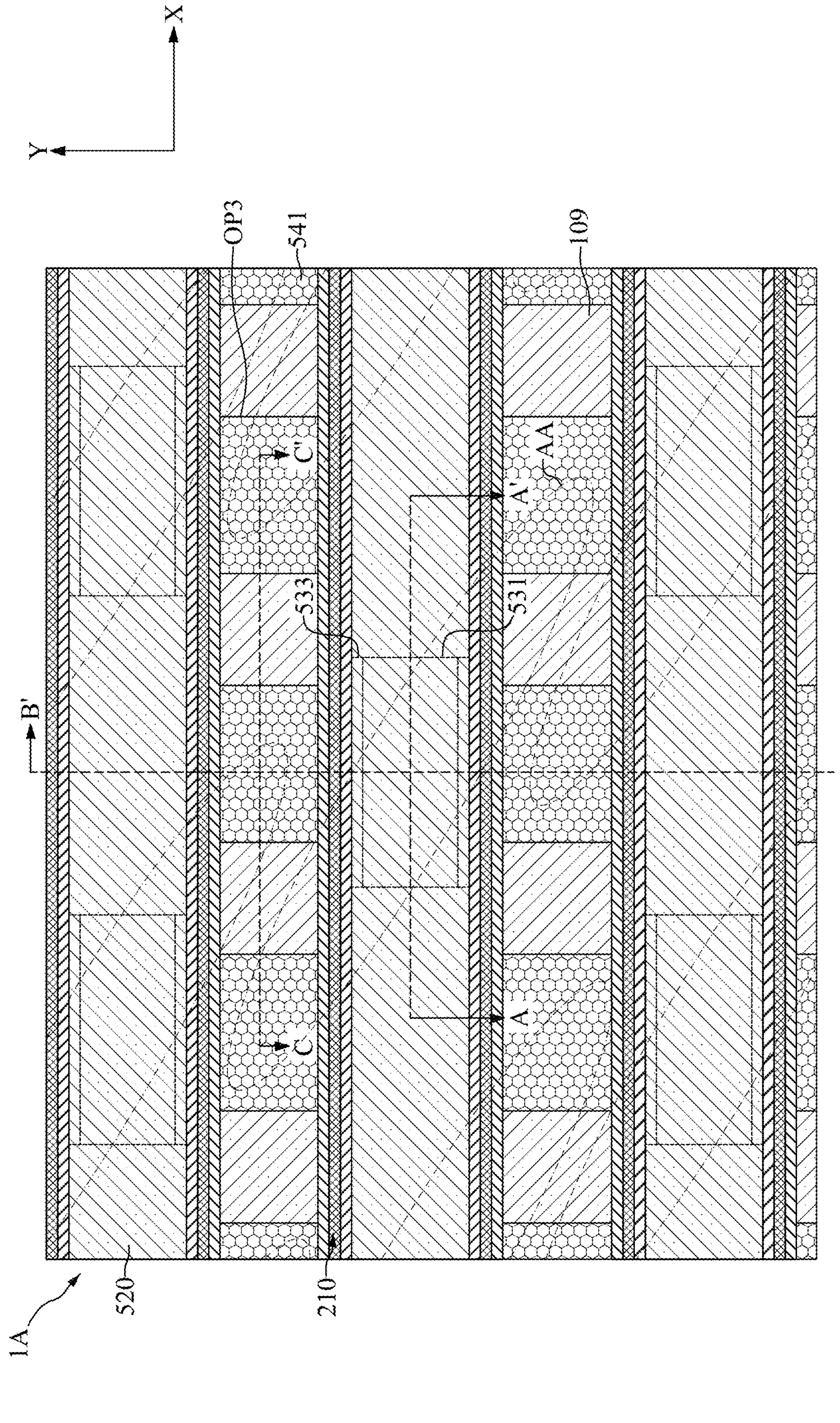
FIG. 41 illustrates, in a schematic top-view diagram, an intermediate semiconductor device in accordance with one embodiment of the present disclosure.
Figure 42:
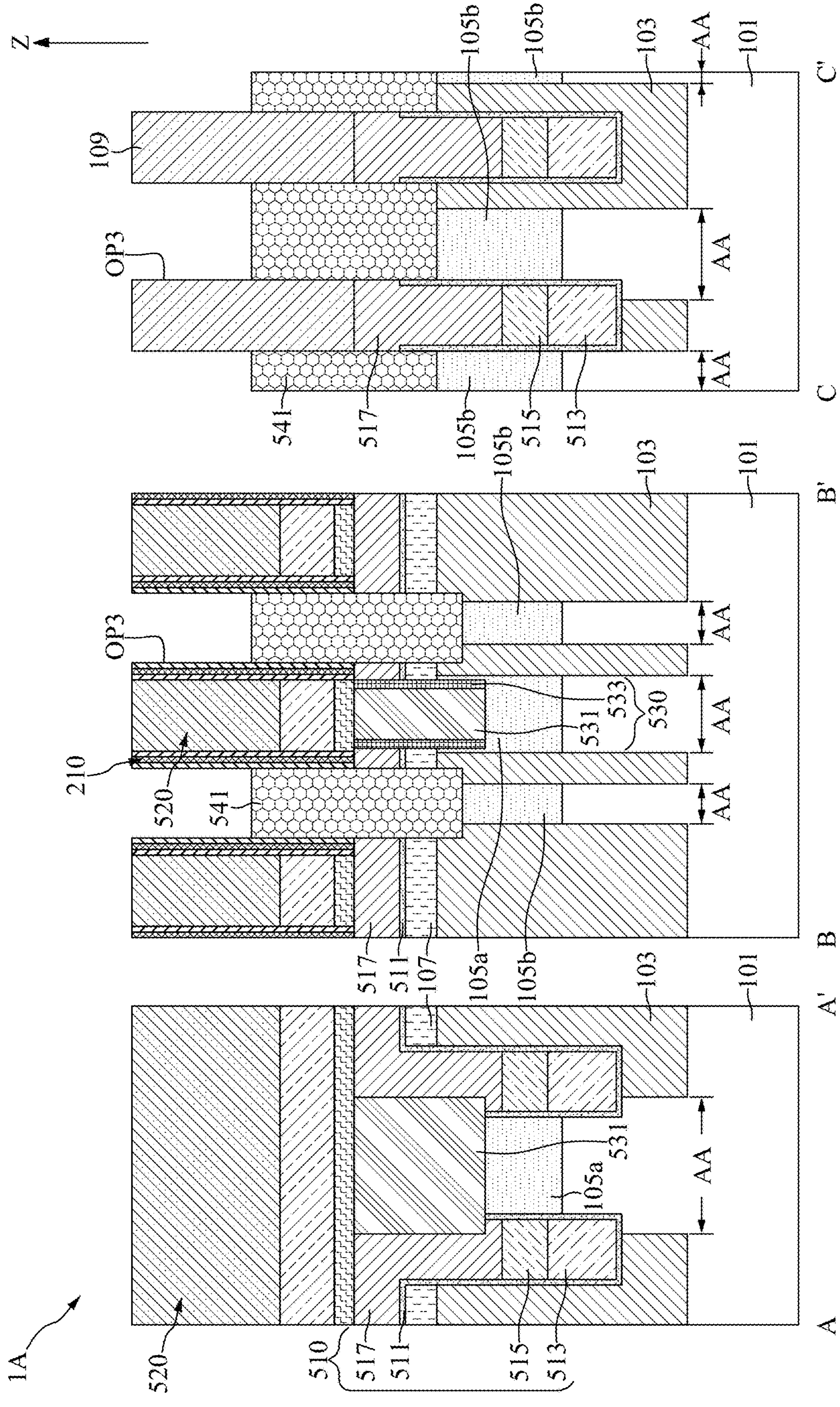
FIG. 42 is a schematic cross-sectional view diagram taken along lines A-A', B-B', and C-C' in FIG. 41.

FIG. 41 illustrates, in a schematic top-view diagram, an intermediate semiconductor device in accordance with one embodiment of the present disclosure. FIG. 42 is a schematic cross-sectional view diagram taken along lines A-A', B-B', and C-C' in FIG. 41.

With reference to FIG. 1 and FIGS. 41 and 42, at step S25, a plurality of cell contact layers 541 may be formed in the plurality of cell contact openings OP3.

With reference to FIGS. 41 and 42, a conductive material (not shown) may be formed to completely fill the plurality of cell contact openings OP3. In some embodiments, the conductive material may be, for example, doped polycrystalline silicon, doped polycrystalline germanium, or doped polycrystalline silicon germanium. In some embodiments, the conductive material may include p-type dopants or n-type dopants. Subsequently, an etching back process may be performed to remove portions of the conductive material. After the etching back process, the remaining conductive material may be turned into the plurality of cell contact layers 541 within the plurality of cell contact openings OP3, respectively and correspondingly.

By employing the contact-isolating spacers 533, the leakage between adjacent bit line structures 520 may be avoided. As a result, the yield and performance of the semiconductor device 1A may be improved. In addition, the parasitic capacitance between the bit line structure 520 and the adjacent cell contact layer 541 may also be reduced by the spacer structure 210. Consequently, the performance of the semiconductor device 1A may be further improved.

Figure 43:
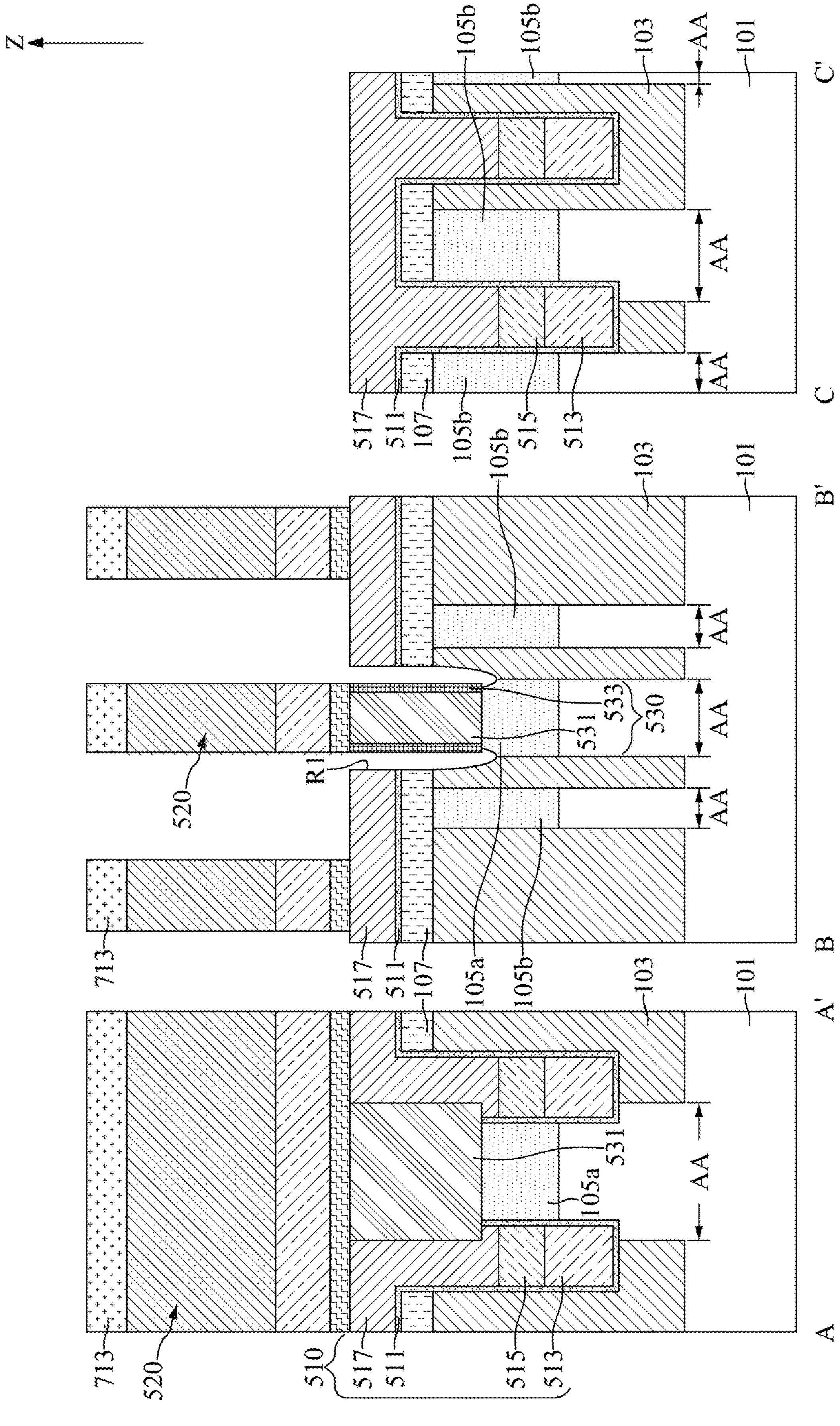
FIGS. 43 to 45 illustrate, in schematic cross-sectional view diagrams, part of a flow for fabricating a semiconductor device in accordance with another embodiment of the present disclosure.
Figure 44:
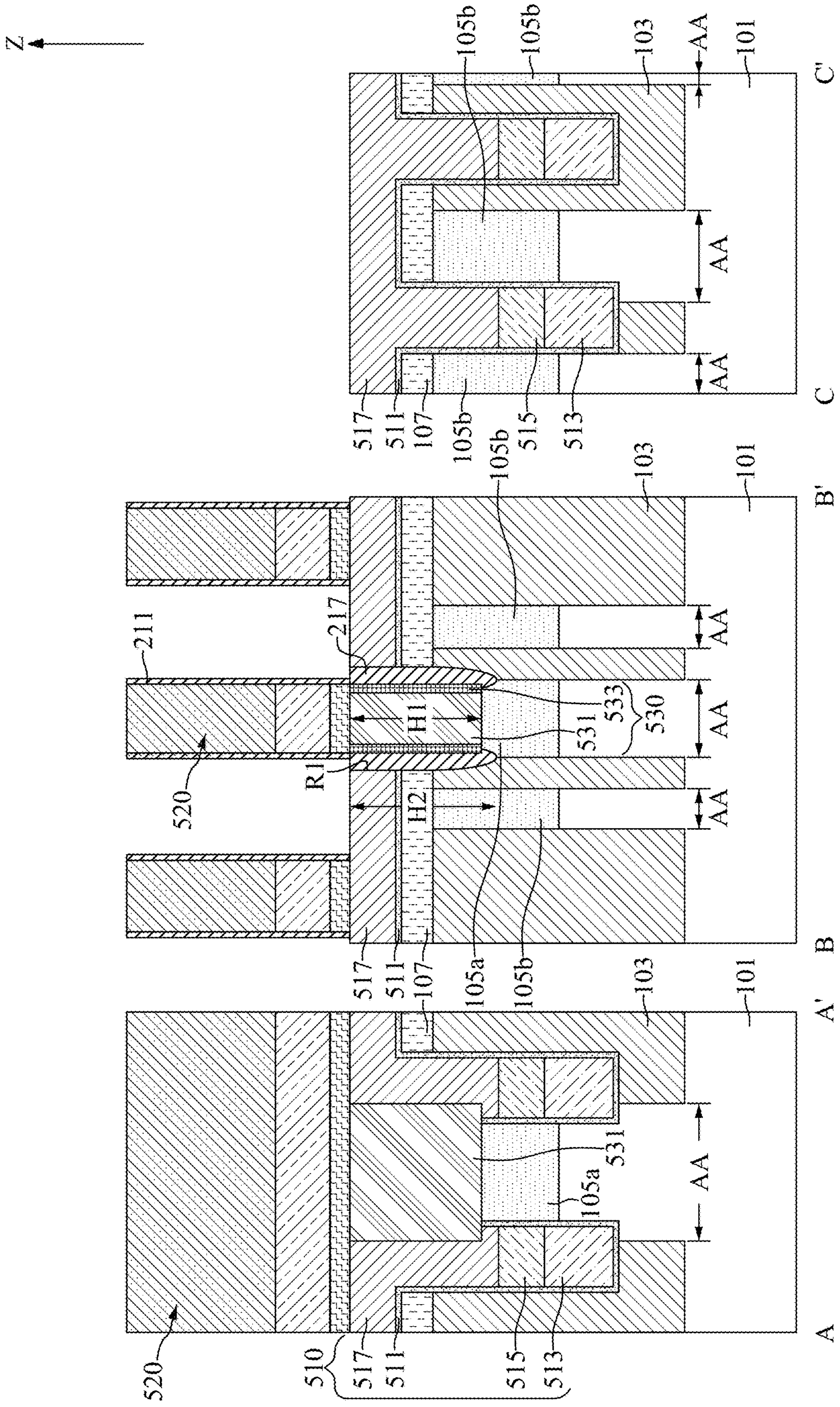
Figure 45:
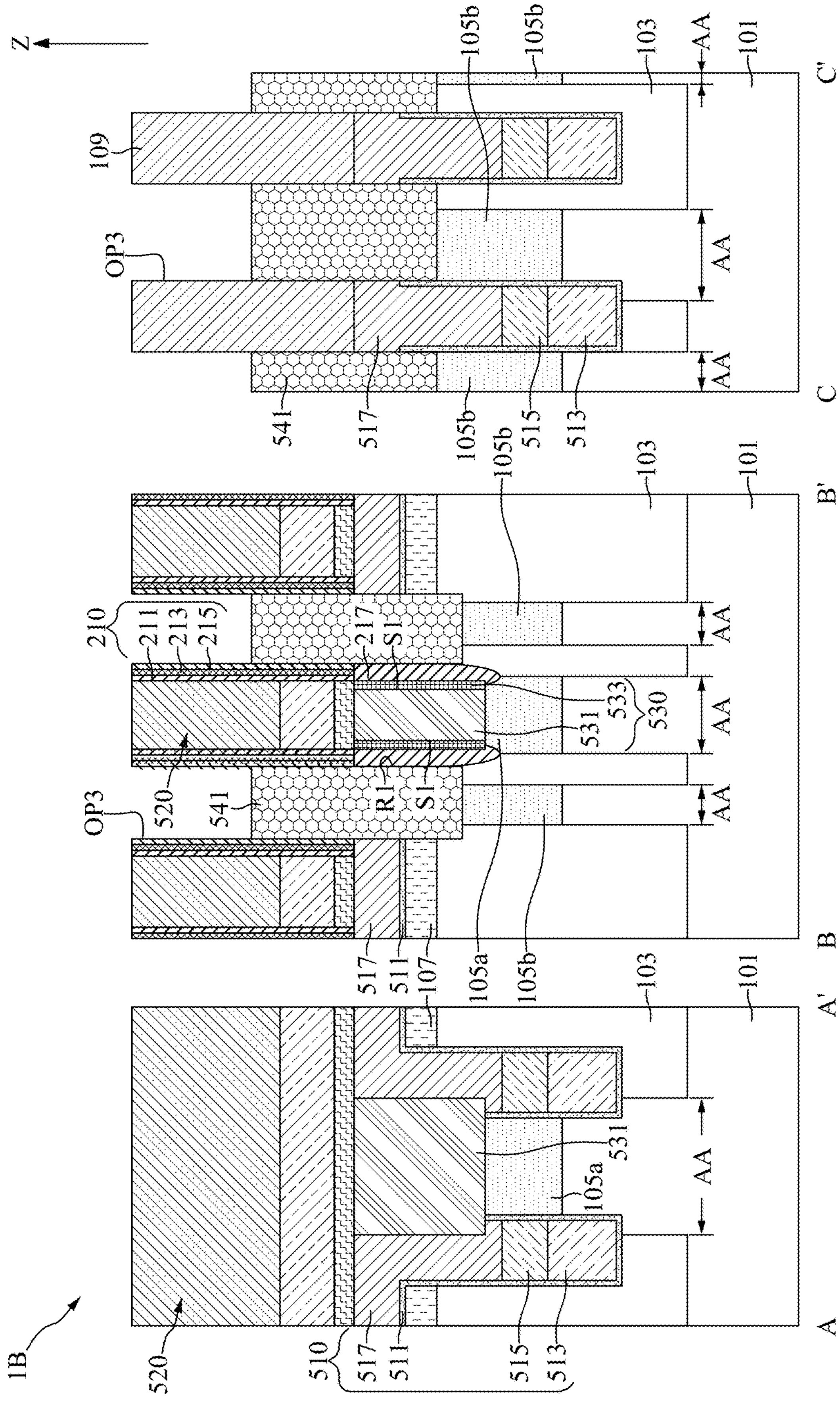

FIGS. 43 to 45 illustrate, in schematic cross-sectional view diagrams, part of a flow for fabricating a semiconductor device 1B in accordance with another embodiment of the present disclosure.

With reference to FIG. 43, an intermediate semiconductor device may be fabricated with a procedure similar to that illustrated in FIGS. 2 to 23. During the etching process for forming the bit line structure 520, a plurality of recesses R1 may be formed towards the substrate 101 and adjacent to the contact-isolating spacers 533.

With reference to FIG. 44, the plurality of inner spacers 211 may be formed with a procedure similar to that illustrated in FIGS. 24 and 25, and descriptions thereof are not repeated herein. The plurality of recesses R1 may also be filled during the formation of the plurality of inner spacers 211 to form a plurality of buried insulating layer 217. The plurality of buried insulating layer 217 may penetrate the word line capping layer 517, the word line dielectric layer 511, the bottom insulating layer 107, and extend to the substrate 101. The plurality of buried insulating layer 217 may be formed adjacent to and covering the contact-isolating spacers 533. In some embodiments, the height H1 of the contact-isolating spacers 533 may be less than the height H2 of the plurality of buried insulating layer 217. The plurality of buried insulating layer 217 may provide additional electrical isolation to the bit line contact structure 530. In some embodiments, the plurality of buried insulating layer 217 may include, for example, silicon nitride or other applicable insulating material.

In some embodiments, the plurality of recesses R1 may be completely filled during the formation of the plurality of middle spacers 213. In some embodiments, the plurality of recesses R1 may be completely filled during the formation of the plurality of outer spacers 215.

With reference to FIG. 45, the plurality of partition layers 109 and the plurality of cell contact layers 541 may be formed with a procedure similar to that illustrated in FIGS. 26 to 42, and descriptions thereof are not repeated herein. By employing the plurality of buried insulating layer 217, the leakage between the cell contact layer 541 and the adjacent bit line contact structure 530 may be reduced or avoided. As a result, the yield and the performance of the semiconductor device 1B may be improved.

One aspect of the present disclosure provides a bit line contact structure, including a bit line contact having a rectangular cross-sectional profile in a top-view perspective and including two first sides parallel to each other and two second sides parallel to each other and perpendicular to the two first sides; and two contact-isolating spacers respectively and correspondingly covering the two first sides of the bit line contact.

Another aspect of the present disclosure provides a semiconductor device including a substrate; a bottom insulating layer positioned on the substrate; a bit line contact structure including a bit line contact positioned penetrating the bottom insulating layer and extending to the substrate, with two parallel first sides along a first direction in a top-view perspective, and two parallel second sides along a second direction perpendicular to the first direction; and two contact-isolating spacers positioned on the two first sides of the bit line contact; and a bit line structure positioned on the bit line contact structure and on the bottom insulating layer and extending along the first direction in a top-view perspective.

Another aspect of the present disclosure provides a method for fabricating a semiconductor device including providing a substrate, forming an impurity region in the substrate, and forming a bottom insulating layer on the substrate; forming two word line structures penetrating the bottom insulating layer, extending to the substrate, and dividing the impurity region into two drain regions with a common source region in between; forming a bit line contact opening penetrating the bottom insulating layer, extending to the substrate, and exposing the common source region; conformally forming a contact-isolating layer covering a sidewall of the bit line contact opening, wherein the contact-isolating layer includes two first portions parallel to each other and extending along a first direction in a top-view perspective and two second portions parallel to each other and extending along a second direction perpendicular to the first direction; forming two hard mask layers masking the two first portions and performing an etching process to remove the two second portions, thereby turning the first portions into two contact-isolating spacers; and removing the two hard mask layers and forming a bit line contact filling the bit line contact opening. The bit line contact and the two contact-isolating spacers together configure a bit line contact structure.

Due to the design of the semiconductor device of the present disclosure, the leakage between adjacent bit line structures 520 may be avoided by employing the contact-isolating spacers 533. As a result, the yield and performance of the semiconductor device 1A may be improved. In addition, the parasitic capacitance between the bit line structure 520 and the adjacent cell contact layer 541 may also be reduced by the spacer structure 210. Consequently, the performance of the semiconductor device 1A may be further improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:

a substrate;

a bottom insulating layer positioned on the substrate;

a word line capping layer disposed above the bottom insulating layer;

a bit line contact structure comprising:

a bit line contact positioned penetrating the bottom insulating layer and the word line capping layer, extending to the substrate, with two parallel first sides along a first direction in a top-view perspective, and two parallel second sides along a second direction perpendicular to the first direction; and two contact-isolating spacers positioned on the two first sides of the bit line contact; and a bit line structure positioned on the bit line contact structure and on the bottom insulating layer and extending along the first direction in a top-view perspective;

wherein top ends of the contact-isolating spacers, one of the two second sides of the bit line contact, and a top surface of the word line capping layer are aligned with each other.

2. The semiconductor device of claim 1, wherein a height of each of the two contact-isolating spacers is equal to a height of the bit line contact which is a distance between the two first sides of the bit line contact.

3. The semiconductor device of claim 1, wherein a width of the bit line contact structure and a width of the bit line structure are substantially the same.

4. The semiconductor device of claim 1, further comprising an impurity region positioned in the substrate, wherein the bit line contact penetrates the bottom insulating layer and extends to the impurity region.

5. The semiconductor device of claim 4, further comprising two isolation layers positioned in the substrate, parallel to each other, and extending along the second direction in a top-view perspective;

wherein the isolation layers are extended into the impurity region to divide the impurity region into a common source region between the isolation layers and two drain regions separated from each other with the common source region;

wherein the bit line contact penetrates the bottom insulating layer and extends to the common source region between the isolation layers.

6. The semiconductor device of claim 4, wherein the bit line structure comprises:

a bit line bottom conductive layer positioned on the bit line contact structure and the bottom insulating layer;

a bit line top conductive layer positioned on the bit line bottom conductive layer; and a bit line capping layer positioned on the bit line top conductive layer;

wherein the top ends of the contact-isolating spacers are in direct contact with the bit line bottom conductive layer.

7. The semiconductor device of claim 4, further comprising two spacer structures positioned on the bottom insulating layer and covering sides of the bit line structure;

wherein the two spacers structures do not contact the bit line contact.

8. The semiconductor device of claim 7, wherein the two spacer structures respectively comprises:

an inner spacer covering the side of the spacer structure;

a middle spacer covering the inner spacer; and an outer spacer covering the middle spacer;

wherein heights of the inner spacer, the middle spacer, and the outer spacers are equal.

9. The semiconductor device of claim 8, further comprising two cell contact layers positioned adjacent to the two spacer structures, separated from each other with the bit line structure in between, penetrating the bottom insulating layer, and extending to the substrate.

10. The semiconductor device of claim 9, the two cell contact layers are positioned on the two drain regions.

11. The semiconductor device of claim 8, wherein the middle spacer comprises silicon oxide.

12. The semiconductor device of claim 8, wherein the inner spacer and the outer spacer comprise the same material.

13. The semiconductor device of claim 6, wherein the bit line bottom conductive layer comprises doped polycrystalline silicon, doped polycrystalline germanium, doped polycrystalline silicon germanium, or a combination thereof.

14. The semiconductor device of claim 6, wherein the bit line top conductive layer comprises titanium, nickel, platinum, tantalum, cobalt, silver, copper, or aluminum.

15. The semiconductor device of claim 1, wherein the bit line contact comprises tungsten, cobalt, zirconium, tantalum, titanium, aluminum, ruthenium, copper, metal carbides, metal nitrides, transition metal aluminides, or a combination thereof.

16. The semiconductor device of claim 1, wherein the contact-isolating spacers comprise silicon nitride.

17. The semiconductor device of claim 1, wherein a ratio of a width of the two contact-isolating spacers to a width of the bit line contact is between about 0.90 and 1.00.

18. The semiconductor device of claim 1, further comprising two buried insulating layers covering the two contact-isolating spacers.

19. The semiconductor device of claim 18, wherein a height of the two contact-isolating spacers is less than a height of the two buried insulating layers.

* * * * *